(12) United States Patent
Hayashi et al.

(10) Patent No.: US 6,593,689 B2
(45) Date of Patent: Jul. 15, 2003

(54) ORGANIC LIGHT-EMITTING DEVICE

(75) Inventors: Kazuhiko Hayashi, Tokyo (JP); Takashi Fukuchi, Tokyo (JP); Shinnzo Tsuboi, Tokyo (JP); Atsushi Oda, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 10/087,059

(22) Filed: Feb. 28, 2002

(65) Prior Publication Data

US 2002/0121859 A1 Sep. 5, 2002

(30) Foreign Application Priority Data

Mar. 1, 2001 (JP) ......................................... 2001-056190

(51) Int. Cl.[7] .............................................. H01L 33/00
(52) U.S. Cl. .......................................... 313/504; 257/94
(58) Field of Search ............................ 313/504; 257/94, 257/97, 102, 103, 22; 428/195, 690, 691, 917

(56) References Cited

U.S. PATENT DOCUMENTS 6,452,216 B1 * 9/2002 Tsuda et al. .................. 257/94

FOREIGN PATENT DOCUMENTS

| JP | 2692671 | 9/1997 |
| JP | 10-189243 | 7/1998 |
| JP | 11-214162 | 8/1999 |

OTHER PUBLICATIONS

Applied Physics Letters, vol. 51, No. 12, Sep. 21, 1987, pp. 913–915.
Applied Physics Letters, vol. 65, No. 21, Nov. 21, 1994, pp. 2636–2638.

* cited by examiner

*Primary Examiner*—James Clinger
(74) *Attorney, Agent, or Firm*—Hayes Soloway P.C.

(57) ABSTRACT

An organic light-emitting device is provided, which increases the proportion of available light as much as possible and which produces higher brightness with less input power. The light-emitting device comprises: (a) a base having a surface; (b) a first electrode and a second electrode formed on the surface of the base; the first and second electrodes being located to be opposite to each other; (c) a light-emitting material layer located between the first and second electrodes; the light-emitting material layer having a first part and a second part; the first part being inclined with respect to the surface of the base at an inclination angle within a range from 45° to 90°; the second part being approximately parallel to the surface of the base; and (d) a carrier-blocking layer formed between the first electrode and the second part of the light-emitting material layer; the carrier-blocking layer having a function of blocking carriers emitted from the first electrode into the light-emitting material layer. The first part of the light-emitting material layer forms as a light-emitting region while the second part of the light-omitting material layer forms a non-light-emitting region. The output light is emitted from the light-emitting material layer by way of the base or the second electrode.

20 Claims, 24 Drawing Sheets

FIG. 22
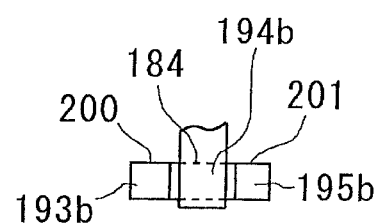
FIG. 23A
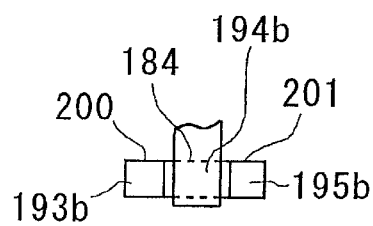
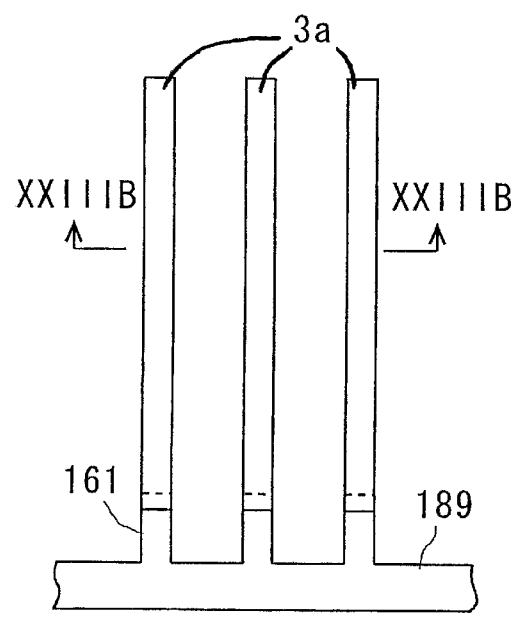
FIG. 23B
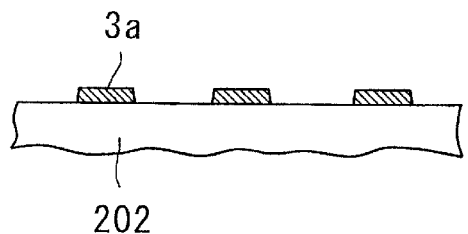

ORGANIC LIGHT-EMITTING DEVICE

BACKGROUND OF THE INVENTION

1. Field of the Invention

The present invention relates to an organic light-emitting device. More particularly, the invention relates to an organic light-emitting device having a light-emitting element comprising a pair of electrodes and an organic light-emitting material layer sandwiched by the electrodes. This device is applicable to various types of display device.

2. Description of the Related Art

Electro-Luminescence (EL) elements are one of the types of light-emitting elements designed for display devices EL elements are divided into two types, "organic EL elements" using an organic material layer as the light-emitting layer and "inorganic EL elements" using an inorganic material layer as the light-emitting layer.

The basic configuration of organic EL elements comprises an anode, a cathode, and a thin, layer-shaped organic EL structure made of an organic light-emitting (i.e., electroluminescent, EL) compound or compounds sandwiched by the anode and the cathode. If a proper voltage is applied across the anode and cathode, holes are injected from the anode into the organic EL structure and at the same time, electrons are injected from the cathode into the same structure, resulting in recombination of the holes and electrons. Due to the energy generated by the recombination, the molecules of the material that forms the EL layer are excited. These molecules thus excited will be returned to their energetic ground states, in other words, deactivated. During this deactivation process, a light-emitting (i.e., EL) phenomenon will occur. The above-described organic EL elements utilize this phenomenon.

The organic EL structure comprises an organic layer termed the "light-emitting layer" that emits light using the recombination of holes and electrons. If necessary, an organic layer termed the "hole-transportation layer" and/or an organic layer termed the "electron-transportation layer" are additionally provided. The "hole-transportation layer" has a property that injection of holes is easy while transportation of electrons is difficult. The "electron-transportation layer" has a property that injection of electron is easy while transportation of holes is difficult.

Thus, if the El structure comprises only the light-emitting layer, it has a single-layer structure. If the EL structure comprises at least one of the hole-transportation layer and the electron-transportation layer along with the light-emitting layer, it has a multi-layer (i.e., two- or three-layer) structure.

In recent years, organic EL elements have been vigorously researched and they are on the way to put them into practice. These prior-art organic EL elements have the basic configuration comprising a transparent electrode (i.e., a hole-injection electrode, anode), a thin hole-injection material layer formed on the transparent electrode, a light-emitting layer formed on the hole-injection material layer, and a metal electrode (i.e., an electron-injection electrode, cathode). The transparent electrode for hole injection (i.e., anode) is made of an indium sin oxide (ITO) or she like. The hole-injection material layer is made of triphenyl diamine (TPD) or the like, which is formed by evaporation. The light-emitting layer is made of a fluorescent material, such as an aluminum quinolinol complex ($Alq_3$). The metal electrode for electron injection (i.e., cathode) is made of a metal having a low work function, such as AgMg.

These prior-art organic EL elements afford us very high brightness of several hundreds $cd/m^2$ to several hundreds thousands $cd/m^2$ as a voltage of approximately 10 V. Therefore, they have been drawing our attention because of their application fields, such as lighting, light sources, display devices for so-called OA (office automation) instruments, household electrical appliances, automobiles, motorcycles, and airplanes.

For example, the prior-art EL elements designed for these application fields have the configuration that the organic layers (e.g., the light-emitting or EL layer) are sandwiched by the scan electrodes (i.e., common line electrodes) serving as the electron-injection electrodes and the data electrodes (i.e., segment line electrodes) serving as the hole-injection (transparent) electrodes. The organic layers and the scan and data electrodes are located on a transparent substrate, such as a glass plate.

The display devices including the light-emitting elements are divided into two groups, the "matrix type" and the "segment type". With the "matrix type", the light-emitting elements, which are arranged in the form of a matrix, are driven by the scan and data electrodes to form a dot matrix on the display screen. Desired information, such as images and/or characters, is displayed on the screen as a set of the dots. On the other hand, with the "segment type", a set of display segments is prepared in advance. These segments are separately formed in the screen, each of which has a predetermined shape and size. Desired information is displayed on the screen as a combination of the segments.

With the segment-type display devices, each of the display segments may be driven separately from each other. Unlike this, with the matrix-type display devices, the dynamic drive method has been adopted in such a way that the scan lines and the data lines are driven in the time-division manner.

The configuration of the light-emitting device comprising the light-emitting element is divided into two types, i.e., the "substrate-surface-emission" type and the "layer-surface-emission" type.

With the "substrate-surface-emission" type, the four-layer structure made of the transparent substrate, the transparent electrode (i.e., the hole-injection electrode or anode), the light-emitting layer, and the metal electrode (i.e., the electron-injection electrode or cathode) formed in this order is used. The light generated in the light-emitting layer is emitted to the outside from the surface of the substrate by way of the transparent electrode and the transparent substrate. An example of this type is disclosed in the paper, Applied Physics Letters, Vol. 51, No. 12, Sep. 21, 1987, pp. 913–915.

On the other hand, with the "layer-surface-emission" type, the four-layer structure made of the substrate, the metal electrode (i.e., the electron-injection electrode or cathode), the light-emitting layer, and the transparent electrode (i.e., the hole-injection electrode or anode) formed in this order is used. The light generated in the light-emitting layer is emitted to the outside from the opposite surface of the transparent electrode to the substrate by way of the transparent electrode. An example of this type is disclosed in the paper, Applied Physics Letters, Vol. 65, No. 21, Nov. 21, 1994, pp. 2636–2638.

A typical configuration of the prior-art organic light-emitting devices of this type is shown in FIG. 1.

The light-emitting device of FIG. 1 comprises a light-emitting element 100 formed on a transparent substrate 105. The substrate 105 is formed by a transparent plate. A current-supplying element 102 is connected to the element 100 to supply an electric current to the element 100. A switching element 101 is connected to the element 102.

Typically, although not shown here, the light-emitting element 100 has a five-layer structure made of a transparent electrode (i.e., a hole-injection electrode or anode), a hole-injection layer, a light-emitting layer, an electron-transportation layer, and a metal electrode (i.e., an electron-injection layer or cathode) stacked on the substrate 105 in this order. The transparent electrode is the nearest to the substrate 105. As each of the current-supplying element 102 and the switching element 101, a Thin-Film Transistor (TFT) of the Metal-Oxide-Semiconductor (MOS) type is typically used.

With the prior-art light-emitting device of FIG. 1, the light emitted from the light-emitting layer of the light-emitting element 100 travels vertically through the substrate 105 to its surface 106. Since the refractive index of the substrate 105 is greater than that of the air, the component of the light whose incident angle is equal to the critical angle or greater is unable to go to the outside of the substrate 105. This means that this component will be unavailable light 104 due to total internal reflection. On the other hand, the component of the light whose incident angle is less than the critical angle is able to go to the outside of the substrate 105. This means that this component will be available light 103.

For this reason, the prior-art device of FIG. 1 has a high proportion of loss of light and thus, the obtainable ratio of the output light to the input power is as low as approximately 20%. As a result, if proper brightness is ensured as desired, there arises a problem that the power consumption increases and at the same time, the device lifetime decreases. Conversely, if power consumption is lowered, there arises another problem that desired brightness is not obtainable.

The above explanation relates to the prior-art organic light-emitting device of the substrate-surface-emission type. With the prior-art organic light-emitting device of the layer-surface-emission type, a similar problem will occur, because a silicon oxide layer or a silicon nitride layer is usually used as the surface protection layer.

Similar techniques to the invention are disclosed in the Japanese Patent No. 2692671 issued on Sep. 5, 1997, the Japanese Non-Examined Patent Publication No. 10-183243 published on Jul. 21, 1998, and the Japanese Non-Examined Patent Publication No. 11-214162 published on Aug. 6, 1999.

The Japanese Patent No. 2692671 discloses the structure of a resonator-type organic thin-film EL element. In this structure, a depression is formed in the transparent substrate. The light-emitting section is located in the depression of the substrate. However, with this structure, a desired directionality is given to the light to be emitted. Therefore, this structure is quite different from the structure of the invention.

The Japanese Non-Examined Patent Publication No. 10-189243 discloses the structure of an EL display device. This device comprises a lower electrode, a lower insulating layer, a light-emitting layer, an upper insulating layer, and an upper electrode stacked on a main surface of a substrate. Tapered depressions are formed on the main surface of the substrate. The interface between the lower electrode and the lower insulating layer, the interface between the lower insulating layer and the light-emitting layer, the interface between the light-emitting layer and the upper insulating layer, and the interface between the upper insulating layer and the an upper electrode are formed to be parallel to the tapered surface of the depression.

With the structure of the Japanese Non-Examined Patent Publication No. 10-19243, however, the depressions need to be formed in advance and thus, there is a difficulty in the fabrication processes. Moreover, since the lower insulating layer is formed between the lower electrode and the light-emitting layer and at the same lime, the upper insulating layer is formed between the upper electrode and the light-emitting layer, there is a problem that the injection efficiencies of electrons and holes into the light-emitting layer degrade, and that the fabrication cost rises.

The Japanese Non-Examined Patent Publication No. 11-214162 discloses the structure of an organic EL element, which comprises at least one thin organic layer located between a pair of opposing electrodes. Minute protrusions are formed on one of the electrodes located at the emission side of the element while minute depressions are formed on the other electrode corresponding to the respective protrusions.

With the structure of the Japanese Non-Examined Patent Publication No. 11-214162, however, no explanation about the inclination angle of the minute protrusions is disclosed. Moreover, the light generated in the organic layer is taken out of the element by way of at least one of the electrodes. Therefore, there is the need to form the electrode or electrodes through which the light is taken out with a material having high transmittance of light. This means that there is a disadvantage that the type of applicable materials for the electrodes is limited.

SUMMARY OF THE INVENTION

The invention was created to solve the problems or disadvantages of the above-described prior-art structures and to raise the output efficiency of light more.

Accordingly, an object of the present invention is to provide an organic light-emitting device that increases the proportion of available light as much as possible.

Another object of the present invention is to provide an organic light-emitting device that produces higher brightness with less input power.

Still another object of the present invention is to provide an organic light-emitting device that prevents the total internal reflection effectively at the interface between the device and the air, thereby raising the light-outputting efficiency.

A further object of the present invention is to provide an organic light-emitting device that suppresses its inner absorption of light to thereby improve the utilization efficiency of light.

A still further object of the present invention is to provide an organic light-emitting device that suppresses unavailable emission of light to thereby improve the light-emitting efficiency of the light-emitting element.

The above objects together with others not specifically mentioned will become clear to those skilled in the art from the following description.

According to a first aspect of the invention, an organic light-emitting device is provided. This device comprises:
(a) a base having a surface;
(b) a first electrode and a second electrode formed on the surface of the base;
   the first and second electrodes being located to be opposite to each other;
(c) a light-emitting material layer located between the first and second electrodes;
   the light-emitting material layer having a first part and a second part;

the first part being inclined with respect to the surface of the base at an inclination angle within a range from 45° to 90°;

the second part being approximately parallel to the surface of the base; and (d) a carrier-blocking layer formed between the first electrode and the second part of the light-emitting material layer;

the carrier-blocking layer having a function of blocking carriers emitted from the first electrode into the light-emitting material layer;

wherein the first part of the light-emitting material layer forms as a light-emitting region while the second part of the light-emitting material layer forms a non-light-emitting region due to the function of the carrier-blocking layer;

and wherein output light is emitted from the light-emitting region of the light-emitting material layer.

With the organic light-emitting device according to the first aspect of the invention, the carrier-blocking layer is formed between the first electrode and the second part of the light-emitting material layer, where the second part is approximately parallel to the surface of the base. The first part of the light-emitting material layer, which is inclined to the surface of the base at the inclination angle within the range from 45° to 90°, serves as the light-emitting region and at the same time, the second part of the light-emitting material layer serves as the non-light-emitting region.

Thus, the output light is emitted from only the light-emitting region of the light-emitting material layer. This means that the output light penetrates the interface between the base and the outside air (or, the interface between the second electrode and the outside air) at smaller incident angles than the prior-art device.

Therefore, if the output light is emitted to the outside by way of the base, internal total reflection in the base is effectively suppressed. If the output light is emitted to the outside by way of the second electrode, internal total reflection in the second electrode is effectively suppressed.

As a result, unavailable light is effectively decreased and thus, the proportion of available light is increased as much as possible. In other words, unavailable emission of light is suppressed to thereby improve the light-outputting efficiency.

Furthermore, due to the raised light-outputting efficiency, higher brightness can be produced with less input power.

According to a second aspect of the invention, another organic light-emitting device is provided. This device comprises:

(a) a base having a surface;

(b) a first electrode and a second electrode formed on the surface of the base;

the first and second electrodes being located approximately to be opposite to each other;

(c) a light-emitting material layer located between the first and second electrodes;

the light-emitting material layer having a first part inclined with respect to the surface of the base at an inclination angle within a range from 45° to 90°; and (d) a carrier-blocking layer formed between the first electrode and the second electrode;

the carrier-blocking layer having a function of blocking carriers emitted from the first electrode into the light-emitting material layer;

wherein the first part of the light-emitting material layer forms a light-emitting region while the carrier-blocking layer forms a non-light-emitting region;

and wherein output light is emitted from the light-emitting region of the light-emitting material layer.

With the organic light-emitting device according to the second aspect of the invention, the first part of the light-emitting material layer forms a light-emitting region while the carrier-blocking layer forms a non-light-emitting region. Thus, there are the same advantages as those of the device according to the first aspect.

According to a third aspect of the invention, a still another organic light-emitting device is provided. This device comprises:

(a) a base having a surface;

(b) a first electrode formed on the surface of the base;

the first electrode having an approximately rectangular or trapezoidal cross section perpendicular to the surface of the base;

the first electrode being elongated to extend along the surface of the base;

the first electrode having a top face opposite to the surface of the base and a pair of side faces located on opposite sides of the first electrode;

(c) a carrier-blocking layer formed to contact the top face of the first electrode;

the carrier-blocking layer having a function of blocking carriers emitted from the first electrode;

(d) a light-emitting material layer formed to extend along the first electrode in such a way as to contact the pair of side faces of the first electrode and the carrier-blocking layer; and (e) a second electrode formed on the light-emitting layer;

wherein a first part of the light-emitting material layer that contacts the carrier-blocking layer forms as a non-light-emitting region while a second part of the light-emitting material layer that contacts the light-emitting material layer forms a light-emitting region;

and wherein output light is emitted from the light-emitting region of the light-emitting material layer.

With the organic light-emitting device according to the third aspect of the invention, because of substantially the same reason as the device of the first aspect, there are the same advantages as those of the device according to the first aspect are obtainable.

According to a fourth aspect of the invention, a further organic light-emitting device is provided. This device comprises:

(a) a base having a surface;

(b) a first electrode formed on the surface of the base;

the first electrode having an approximately rectangular or trapezoidal cross section perpendicular to the surface of the base;

the first electrode being elongated to extend along the surface of the base;

the first electrode having a top face opposite to the surface of the base and a pair of side faces located on opposite sides of the first electrode;

(c) a carrier-blocking layer formed to contact the top face of the first electrode;

the carrier-blocking layer having a function of blocking carriers emitted from the first electrode;

(d) a light-emitting material layer formed to extend along the first electrode in such a way as to contact the pair of side faces of the first electrode and the carrier-blocking layer; and (e) a second electrode formed on the light-emitting material layer;

wherein a first part of the light-emitting material layer that contacts the carrier-blocking layer forms as a non-light-emitting region while a second part of the light-emitting material layer that contacts the light-emitting material layer forms a light-emitting region;

and wherein output light is emitted from the light-emitting region of the light-emitting material layer.

With the organic light-emitting device according to the fourth aspect of the invention, because of substantially the same reason as the device of the second aspect, there are the same advantages as those of the device according to the first aspect are obtainable.

BRIEF DESCRIPTION OF THE DRAWINGS

In order that the present invention may be readily carried into effect, it will now be described with reference to the accompanying drawings.

FIG. 22 is a schematic, partial plan view showing the method of fabricating the light-emitting element of the invention and its driving circuit, respectively, which is subsequent to the process of FIG. 21I.

FIG. 23A is a schematic, partial plan view showing the method of fabricating the light-emitting element of the invention and its driving circuit, respectively, which is subsequent to the process of FIG. 22.

FIG. 23B is a schematic, partial cross-sectional view along the line XXIIIB—XXIIIB in FIG. 23A.

DETAILED DESCRIPTION OF THE PREFERRED EMBODIMENTS

Figure 1:
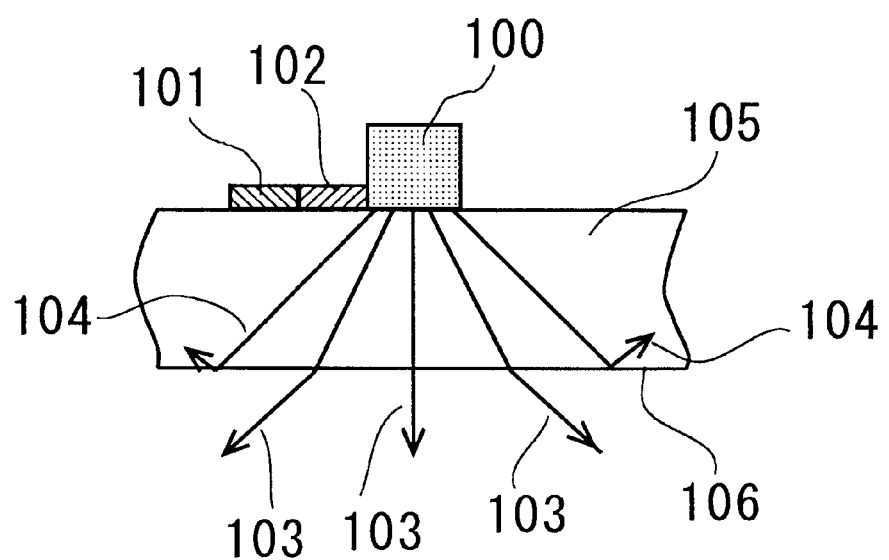
FIG. 1 is a schematic, partial, longitudinal cross-sectional view showing the configuration of a prior-art organic light-emitting device.

Preferred embodiments of the present invention will be described in detail below while referring to the drawings attached.

Configuration of Organic Light-emitting Device

Figure 2A:
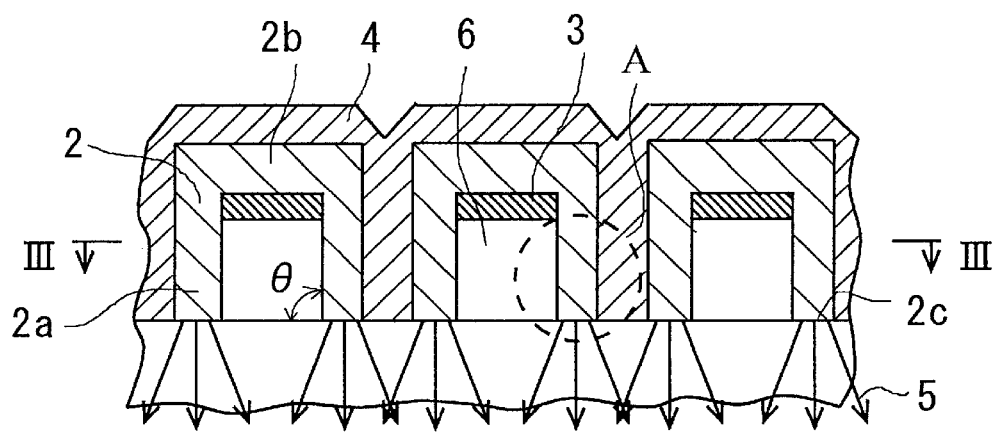
FIG. 2A is a schematic, partial, longitudinal (i.e., perpendicular to the substrate) cross-sectional view showing the configuration of an organic light-emitting device according to a first embodiment of the invention, in which a hole-injection blocking layer is provided between the anode and the cathode.
Figure 3:
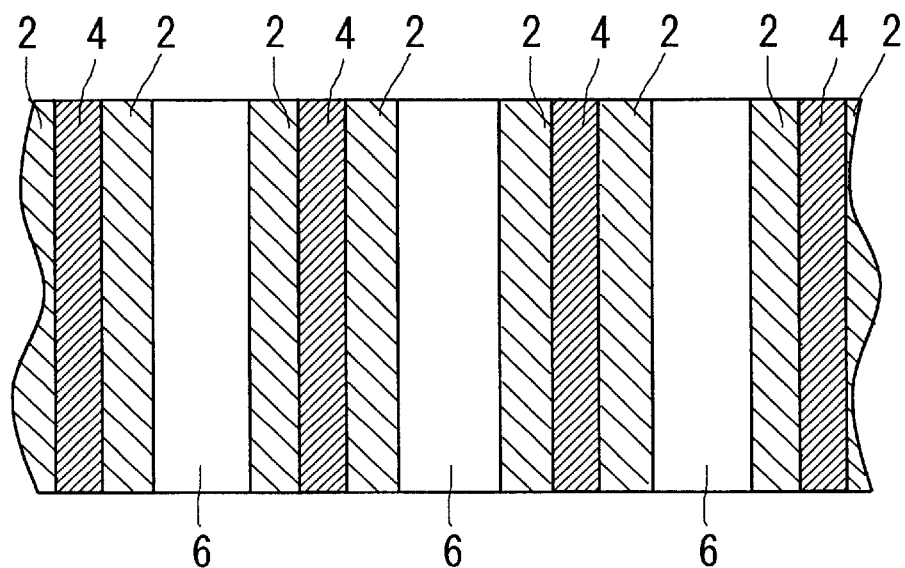
FIG. 3 is a schematic, partial, lateral (i.e., parallel to the substrate) cross-sectional view showing the configuration of the organic light-emitting device according to the first embodiment of FIG. 2A.

An organic light-emitting device according to a first embodiment of the invention has the configuration as shown in FIG. 2A and FIG. 3.

As clearly seen from FIG. 2A, this device comprises a solid base 1 having a flat surface, three anodes 6 formed on the surface of the base 1 at equal intervals, and three hole-injection blocking layers 3 formed on the corresponding anodes 6. Each of the anodes 6 has a rectangular cross-section perpendicular to the surface of the base 1. Each of the blocking layers 3 has a rectangular cross-section perpendicular to the surface of the base 1 as well. The anodes 6 are fixed on the surface of the base 1 at their bottom ends. The layers 3 are fixed on the top ends of the corresponding anodes 6.

As seen from FIG. 3, the anodes 6, which have the same, specific length, are arranged in parallel to extend along the surface of the base 1. The hole-injection blocking layers 3 are arranged in the same way as the anodes 6.

The four side faces of each anode 6 and those of each hole-injection blocking layers 3 are approximately perpendicular to the surface of the base 1. In other words, they are inclined abruptly at an inclination angle θ of 90° with respect to the surface of the base 1.

Each of the anodes 6 and a corresponding one of the hole-injection blocking layers 3 are surrounded by a light-emitting material layer 2. The layer 2 has a cross section of an inverted U character, as shown in FIG. 2A.

Each of the light-emitting material layers 2 is surrounded by a cathode 4. The cathodes 4 for the three layers 2 are connected to each other.

Each of the light-emitting material layers 2 is divided into a non-light-emitting region 2b and two light-emitting regions 2a located at each side of the region 2b. The non-light-emitting region 2b is a region of the layer 2 sandwiched by the top face of the anode 6 and the opposing top face of the cathode 4. The light-emitting regions 2a are regions of the layer 2 sandwiched by the side faces of the anode 6 and the opposing side faces of the cathode 4. Thus, the non-light-emitting region 2b is located over the top of the anode 6 and the two light-emitting regions 2a are located on the right and left sides thereof.

The anodes 6, the hole-injection blocking layers 3, the light-emitting material layers 2, and the cathodes 4 constitute the organic light-emitting element according to the first embodiment.

The base 1 means a support on which the light-emitting element is formed. If the light-emitting element is formed directly on a substrate, the base 1 means the substrate itself, in other words, the base 1 is the same as the substrate. If the light-emitting structure is formed over a substrate by way of a layer and/or an additional element, the base 1 means the combination of the substrate and the layer and/or the additional element.

Figure 2B:
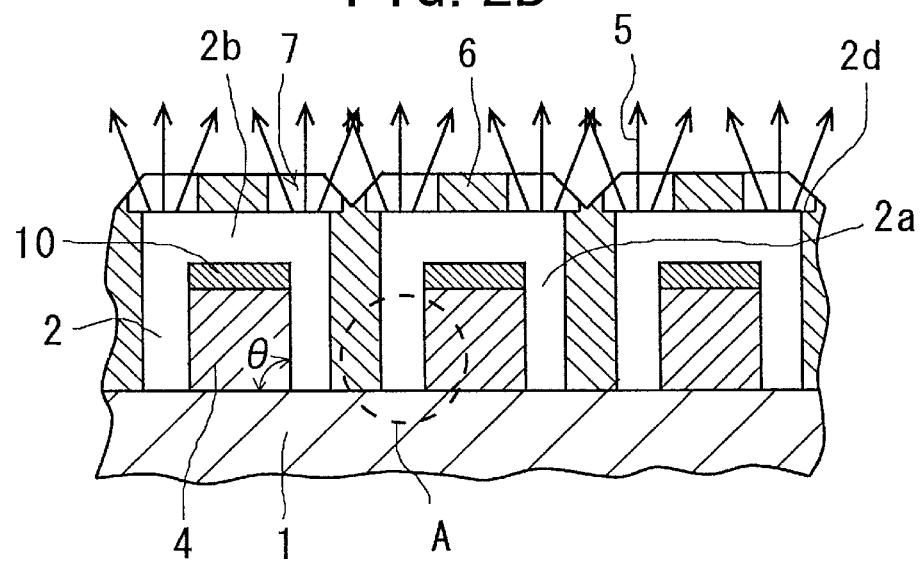
FIG. 2B is a schematic, partial, longitudinal (i.e., perpendicular to the substrate) cross-sectional view showing the configuration of an organic light-emitting device according to a second embodiment of the invention, in which an electron-injection blocking layer is provided between the anode and the cathode.

FIG. 2B shows the configuration of an organic light-emitting device according to a second embodiment of the invention.

As clearly seen from FIG. 2B, this device comprises a solid base 1 having a flat surface, three cathodes 4 formed on the surface of the base 1 at equal intervals, and three electron-injection blocking layers 10 formed on the corresponding cathodes 4. Each of the cathodes 4 has a rectangular cross-section perpendicular to the surface of the base 1. Each of the blocking layers 10 has a rectangular cross-section perpendicular to the surface of the base 1 as well. The cathodes 4 are fixed on the surface of the base 1 at their bottom ends. The layers 10 are fixed on the top ends of the corresponding cathodes 4.

Similar to FIG. 3, the cathodes 4, which have the same, specific length, are arranged in parallel to extend along the surface of the base 1. The electron-injection blocking layers 10 are arranged in the same way as the cathodes 4.

The four side faces of each cathode 4 and those of each electron-injection blocking layers 10 are approximately perpendicular to the surface of the base 1. In other words, they are inclined abruptly at an inclination angle θ of 90° with respect to the surface of the base 1.

Each of the cathodes 4 and the corresponding one of the electron-injection blocking layers 10 are surrounded by a light-emitting material layer 2. The layer 2 has a cross section of an inverted U character, as shown in FIG. 2B.

Each of the light-emitting material layers 2 is surrounded by an anode 6 The anodes 6 for the three layers 2 are connected to each other.

Each of the light-emitting material layers 2 is divided into a non-light-emitting region 2b and two light-emitting regions 2a located at each side of the region 2b. The non-light-emitting region 2b is a region of the layer 2 sandwiched by the top face of the cathode 4 and the opposing top face of the anode 6. The light-emitting regions 2a are regions of the layer 2 sandwiched by the side faces of the cathode 4 and the opposing side faces of the anode 6. Thus, the non-light-emitting region 2b is located over the top of the cathode 4 and the two light-emitting regions 2a are located on the right and left sides thereof.

The cathodes 4, the electron-injection blocking layers 10, the light-emitting material layers 2, and the anodes 6 constitute the organic light-emitting element according to the second embodiment.

At the top of each of the anodes 6, a ring-shaped opening 7 is formed to expose the underlying top end face 2d of the light-emitting material layer 2.

With the organic light-emitting devices according to the first and second embodiments of FIGS. 2A and 2B, a proper voltage is commonly applied across the anodes 6 and the cathodes 4 in such a way that the anodes 6 are positive while the cathodes 4 are negative in operation. In this operating state, holes are injected from the anodes 6 into the light-emitting regions 2a of the light-emitting material layers 2 and at the same time, electrons are injected from the cathodes 4 into the same regions 2a. Thus, holes and electrons thus injected in the regions 2a are recombined together, resulting in EL light emission in the regions 2a.

On the other hand, with the device according to the first embodiment of FIG. 2A, since the hole-injection blocking layers 3 are provided between the tops of the anodes 6 and those of the cathodes 4, no holes are injected from the anodes 6 into the non-light-emitting regions 2b of the light-emitting material layers 2. Thus, hole-electron recombination does not occur in the regions 2b, which means that EL light emission does not occur in the regions 2b.

Similarly, with the device according to the second embodiment of FIG. 2B, since the electron-injection blocking layers 10 are provided between the tops of the cathodes 4 and those of the anodes 6, no electrons are injected from the cathodes 4 into the non-light-emitting regions 2b of the light-emitting material layers 2. Thus, hole-electron recombination does not occur in the regions 2b, which means that EL light emission does not occur in the regions 2b as well.

The light thus generated in the light-emitting regions 2a is temporarily confined within the light-emitting material layers 2. Small part of the light thus confined is absorbed in the surfaces of the anodes 6 or the cathodes 4 or the inside of the layers 2. However, the remaining major part of the light in the regions 2a is irregularly reflected at the surfaces of the anodes 6 and the cathodes 4 and then, emitted from the regions 2a to the outside of the device of the first or second embodiment.

With the device of the first embodiment of FIG. 2A, the light in the regions 2a is emitted downwardly to the outside by way of the respective bottom end faces 2c of the light-emitting material layers 2 and the base 1. The light thus emitted is "available light". Although the light passes through the base 1, it passes through none of the anodes 6 and cathodes 4.

With the device of the second embodiment of FIG. 2B, the light in the regions 2a is emitted upwardly to the outside by way of the respective top end faces 2d of the light-emitting material layers 2 and the ring-shaped openings of the anodes 6. The light thus emitted is "available light". The light does not pass through the anodes 6, the cathodes 4, and the base 1.

The openings 7 of the anodes 6 may be omitted. In this case, the light is emitted through the transparent anodes 6.

In the previously-described prior-art configuration, the proportion of "unavailable light" is large, because of a large proportion of the generated light confined in the light-emitting layers and/or the transparent electrode layers. Unlike this, in the devices of the first and second embodiments, he proportion of the light confined is decreased. Thus, the proportion of available light is increased.

Since the light is emitted through the areas where no electrode is formed in the devises of the first and second embodiments of FIGS. 2A and 2B, the anodes 6 and the cathodes 4 may be made of opaque metal that prevents light from penetrating. In this case, leakage of the light from the light-emitting material layers 2 is decreased effectively and therefore, there arises an additional advantage that the output efficiency (i.e., the utilization efficiency) of light is easily improved.

With the device of the second embodiment of FIG. 2B, the anodes 6 made of opaque metal have a function of light-shielding films. Therefore, there arises another additional advantage that high-contrast display devices can be produced at low cost.

Figure 2C:
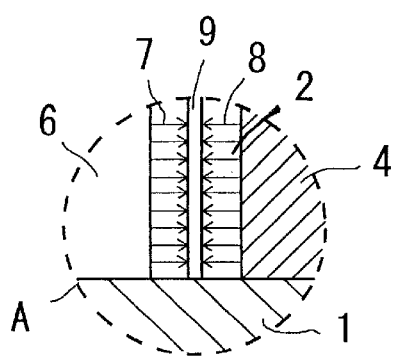
FIG. 2C is a schematic, enlarged, partial cross-sectional view showing the parts A in FIGS. 2A and 2B, in which the recombination operation of electrons and holes are explained.

FIG. 2C shows the enlarged view of the parts A of FIGS. 2A and 2B to show the state of hole-electron recombination. Holes 7 are injected from the anode 6 into the region 9 along the right-oriented arrows and at the same time, electrons 8 are injected from the cathode 4 into the same region 9 along the left-oriented arrows. The holes 7 and the electrons 8 thus injected are recombined in the region 9, resulting in EL emission of light. Thus, the region 9 may be termed the "hole-electron recombination region".

FIG. 3 shows the horizontal cross section of the light-emitting element of the device according to the first embodiment of FIG. 2A, along the line III—III. As seen from this figure, the count of the anodes 6 are three. However, the count may be changed as necessary.

Figure 4:
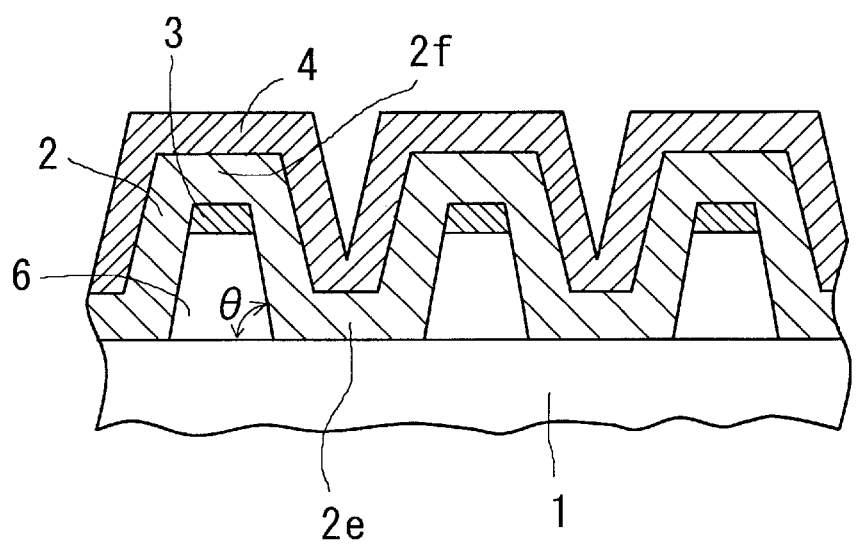
FIG. 4 is a schematic, partial, longitudinal (i.e., perpendicular to the substrate) cross-sectional view showing the configuration of an organic light-emitting device according to a third embodiment of the invention, in which an electron-injection blocking layer is provided between the anode and the cathode.

FIG. 4 shows the configuration of the light-emitting device according to a third embodiment of the invention. The configuration of FIG. 4 is the same as that of the first embodiment of FIG. 2A, except that (i) the anodes 6 and the hole-injection blocking layers 3 are trapezoidal in cross section, and that (ii) the light-emitting material layers 2 have flat regions 2e contacted with the flat surface of the base 1.

The output efficiency of light of the device of the first embodiment is higher than that of the fourth embodiment, because the side walls of the light-emitting material layers 2 are vertical, in other words, the inclination angle $\theta$ of the layers 2 is 90°. However, due to the above-described differences (i) and (ii), the device of the fourth embodiment is easy to be fabricated. Specifically, it is not easy for the layers 2 to be deposited on the abrupt (i.e., vertical) side faces of the anodes 6. Moreover, the layers 2 thus deposited need to be separated from each other by etching. Unlike this, with the device of the fourth embodiment of FIG. 4, there is an additional advantage that the layers 2 can be deposited on the oblique side faces of the anodes 6, and that the separation process (i.e., the etching process) can be canceled.

Figure 5:
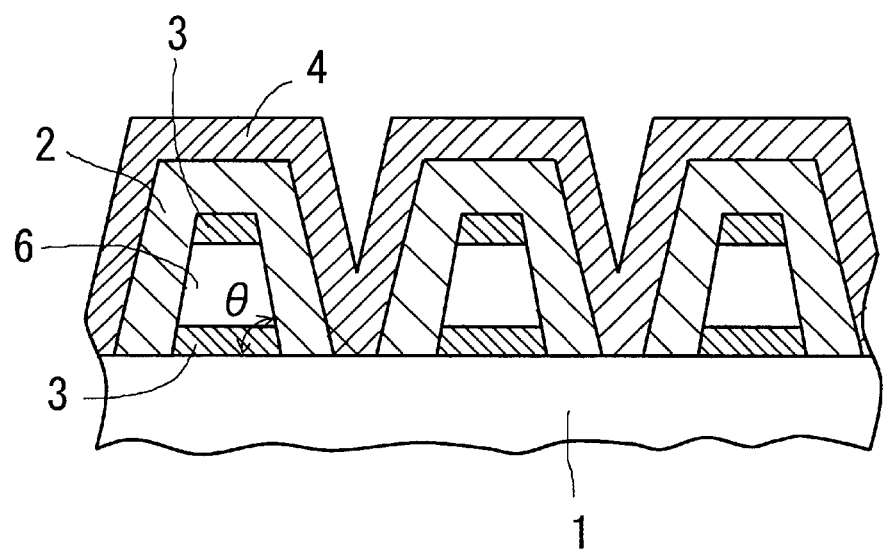
FIG. 5 is a schematic, partial, longitudinal (i.e., perpendicular to the substrate) cross-sectional view showing the configuration of an organic light-emitting device according to a fourth embodiment of the invention, in which an electron-injection blocking layer is provided between the anode and the cathode.

FIG. 5 shows the configuration of the light-emitting device according to a fourth embodiment of the invention. The configuration of FIG. 5 is the sane as that of the third embodiment of FIG. 4, except that (i) the lower flat regions 2e of the light-emitting material layers 2, which are contacted with the flat surface of the base 1, are eliminated, and that (ii) hole-injection blocking layers 3 are added to the bottoms of the respective anodes 6.

With the device of the fourth embodiment of FIG. 5, since the additional regions 2e are not provided, emission of light at the interfaces of the regions 2e and the base 1 is suppressed. Generally, the light emitted at these interfaces will have a large incident angle to the base 1 and therefore, there is a possibility that this light is likely to be unavailable due to reflection at the interfaces. With the device of the fourth embodiment of FIG. 5, since emission of light is effectively suppressed at the interfaces, there is an additional advantage that the output efficiency of light (i.e., the emission efficiency of light) can be raised compared with the device of the first embodiment of FIG. 2A.

Although the count of the anodes 6 is three in the configuration of FIG. 5, it may be changed as necessary.

Figure 6:
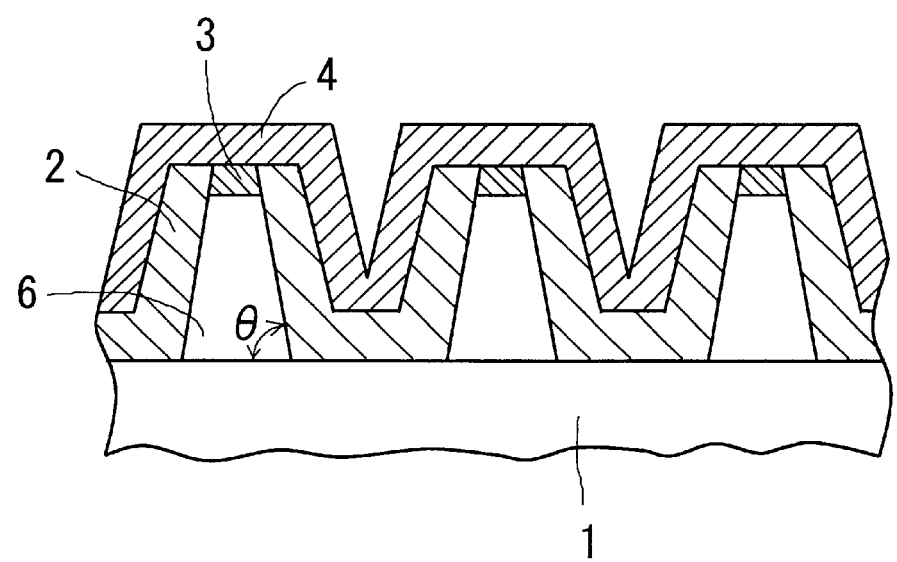
FIG. 6 is a schematic, partial, longitudinal (i.e., perpendicular to the substrate) cross-sectional view showing the configuration of an organic light-emitting device according to a fifth embodiment of the invention, in which an electron-injection blocking layer is provided between the anode and the cathode.

FIG. 6 shows the configuration of the light-emitting device according to a fifth embodiment of the invention. The configuration of FIG. 6 is the same as that of the third embodiment of FIG. 4, except that (i) the upper flat regions 2f of the light-emitting material layers 2, which are located at the tops of the hole-injection blocking layers 3 and contacted with the flat surfaces of the cathodes 4, are eliminated.

With the device of the fourth embodiment of FIG. 5, there is a disadvantage that part of the light emitted in the light-emitting regions 2a of the light-emitting material layer 2 tends to attenuate in the upper flat regions 2f. On the other hand, with the device of the fifth embodiment of FIG. 6, this disadvantage can be prevented.

In addition, the device configurations of the third to fifth embodiments of FIGS. 4 to 6 may be changed in the same way as the device configuration of the second embodiment of FIG. 2B with respect to that of the first embodiment of FIG. 2A.

Specifically, the anodes 6 may be replaced with the cathode 4 and at the same time, the hole-injection blocking layers 3 may be replaced with the electron-injection blocking layers 10, and vice versa in the devices of the third to fifth embodiments. In this case, the structure will be turned to the "layer-surface-emission" type from the "base or substrate-surface-emission" type.

Figure 26A:
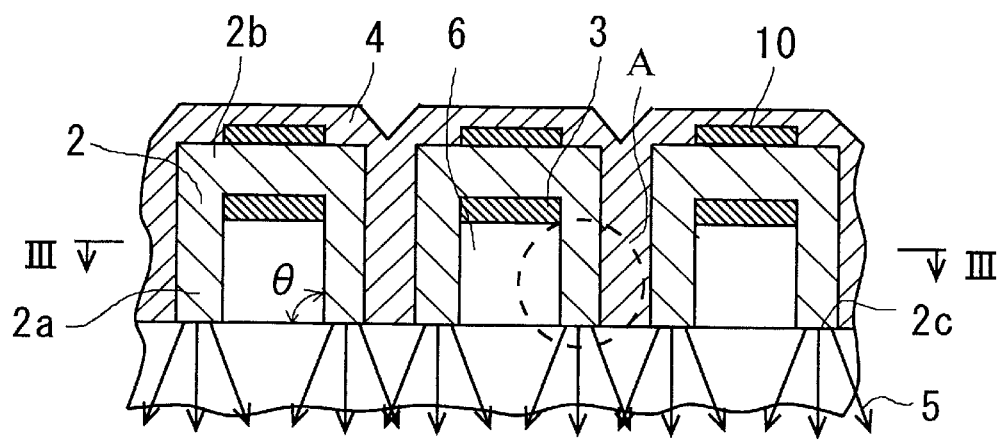
FIG. 26A is a schematic, partial, longitudinal (i.e., perpendicular to the substrate) cross-sectional view showing the configuration of a variation of the organic light-emitting device according to the first embodiment of FIG. 2A.

Moreover, in the first, third, and fourth embodiments of FIGS. 2A, 4, and 5, the hole-injection blocking layers 3 may be replaced with electron-injection blocking layers 10. Additional electron-injection blocking layers 10 may be provided to be opposed to the hole-injection blocking layers 3 by way of the non-light-emitting regions 2b. In this case, for example, the device has the configuration shown in FIG. 26A.

Figure 26B:
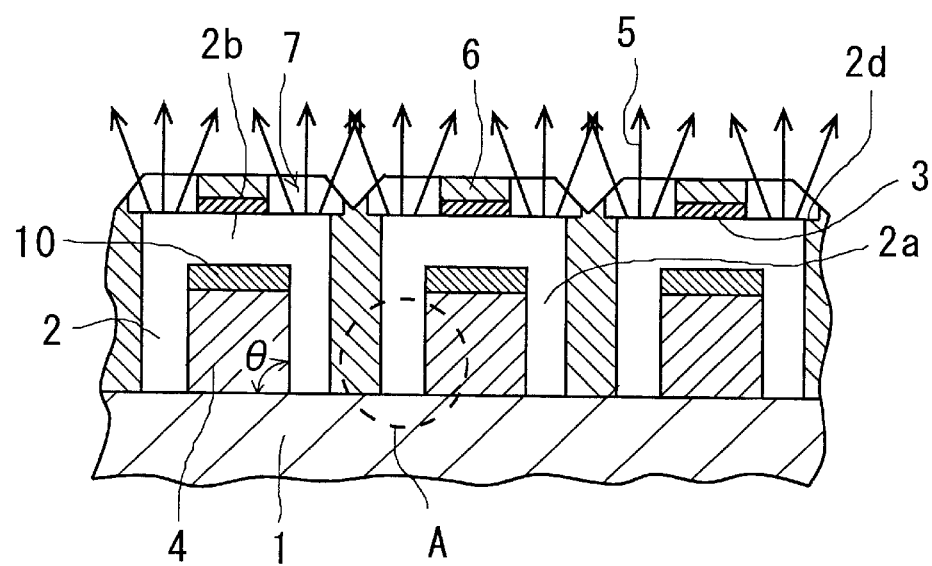
FIG. 26B is a schematic, partial, longitudinal (i.e., perpendicular to the substrate) cross-sectional view showing the configuration of a variation of the organic light-emitting device according to the second embodiment of FIG. 28.

Similarly, in the second embodiment of FIG. 2B, the electron-injection blocking layers 10 may be replaced with hole-injection blocking layers 3. Additional hole-injection blocking layers 3 may be provided to be opposed to the electron-injection blocking layers 10 by way of the non-light-emitting regions 2b. In this case, for example, the device has the configuration shown in FIG. 26B.

Structure of Light-emitting Material Layer

Next, the structure of the light-emitting material layer 2 is explained below with reference to FIGS. 7A to 7E, in which the anode 6 is located at the left side while the cathode 4 is at the right side.

Figure 7A:
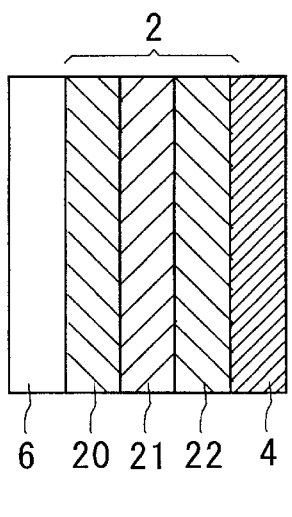
FIGS. 7A to 7E are schematic, partial, lateral (i.e., parallel to the substrate) cross-sectional views showing the various configurations of the light-emitting material layer of the organic light-emitting device according to the invention, respectively.

In the structure of FIG. 7A, a hole-injection/transportation sublayer 20, a light-emitting sublayer 21, and an electron-injection/transportation sublayer 22 are stacked in this order, thereby forming the light-emitting material layer 2. The hole-injection/transportation sublayer 20 has a function of increasing the injection efficiency of holes from the anode 6 and of transporting efficiently the holes thus injected to the light-emitting sublayer 21. The electron-injection/transportation sublayer 22 has a function of increasing the injection efficiency of electrons from the cathode 4 and of transporting efficiently the electrons thus injected to the light-emitting sublayer 21.

The amount of light emission in the light-emitting sublayer 21 varies dependent on the count of recombined holes and electrons therein. Thus, due to the increase of the injection efficiency of holes and electrons by the hole—and electron-injection/transportation sublayers 20 and 22, the amount of light emitted is increased and as a result, higher brightness is obtainable.

Figure 7B:
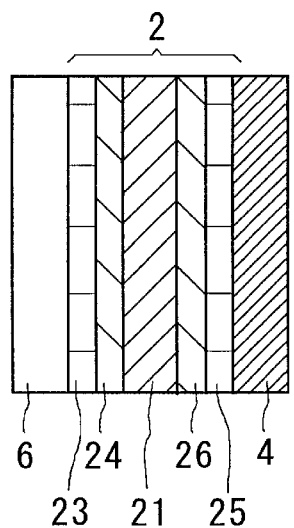

In the structure of FIG. 7B, a hole-injection sublayer 23, a hole-transportation sublayer 24, a light-emitting sublayer 21, an electron-injection sublayer 26, and an electron-transportation sublayer 26 are stacked in this order, thereby forming the light-emitting material layer 2. In the structure of FIG. 7B, the hole-injection/transportation sublayer 20 in FIG. 7A is divided into the hole-injection sublayer 23 and the hole-transportation sublayer 24. The electron-injection/transportation sublayer 22 in FIG. 7A is divided into the electron-injection sublayer 25 and the electron-transportation sublayer 26.

For the hole-injection/transportation sublayer 20, it is necessary to choose a material having a property that both hole-injection and hole-transportation are efficiently conducted. However, with the structure of FIG. 7B, the functions or properties of hole-injection and hole-transportation can be separated by the hole-injection sublayer 23 and the hole-transportation sublayer 24. In other words, desired hole-injection and hole-transportation functions can be realized with the combination of the sublayers 23 and 24. However, the count of sublayers and materials increases and therefore, the fabrication cost will be unavoidably raised. This is applicable to the electron-injection sublayer 25 and the electron-transportation sublayer 26.

If the count of holes transported into the light-emitting sublayer 21 can be sufficient with respect to the count of electrons transported into she same sublayer 21, the hole-injection/transportation sublayer 20 can be used for emitting a desired amount of light in place of the combination of the hole-injection sublayer 24 and the hole-transportation sublayer 25. Moreover, if the count of electrons transported into the light-emitting sublayer 21 can be sufficient, the electron-injection/transportation sublayer 22 can be used for emitting a desired amount of light in place of the combination of the electron-injection sublayer 25 and the electron-transportation sublayer 26.

Figure 7C:
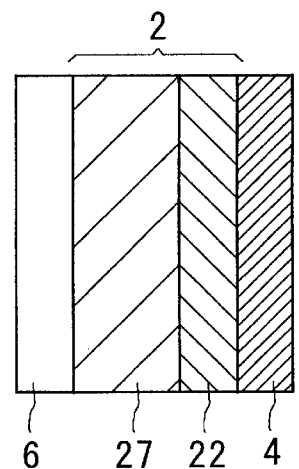

In the structure of FIG. 7C, a light-emitting sublayer 27 having a function of a hole-injection/transportation sublayer, and the electron-injection/transportation sublayer 22 are stacked in this order, thereby forming the light-emitting material layer 2. The simple two-layer structure of FIG. 7C may be realized by using a proper material whose property provides a desired, high hole-injection and hole-transportation efficiency. Since the count of sublayers and the kind of materials are small, the fabrication cost can be lowered. However, some restriction may be applied to choosing the other characteristics of the light-emitting sublayer 27, such as the coloring property. This is because the material for the sublayer 27 needs to have a desired hole-injection/transportation property.

Figure 7D:
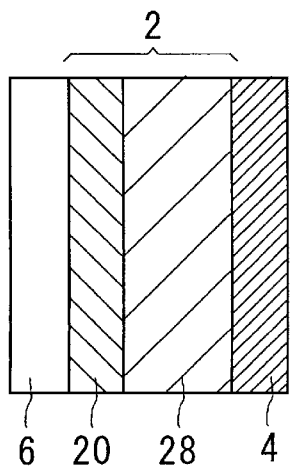

In the structure of FIG. 7D, the hole-injection/transportation sublayer 20 and a light-emitting sublayer 28 having a function of a electron-injection/transportation sublayer are stacked in this order, thereby forming the light-emitting material layer 2. The simple two-layer structure of FIG. 7D may be realized by using a proper material whose property provides a desired, high electron-injection and electron-transportation efficiency. Since the count of sublayers and the kind of materials are small, the fabrication cost can be lowered. However, some restriction may be applied to choosing the other characteristics of the light-emitting sublayer 28, such as the coloring property. This is because the material for the sublayer 28 needs to have a desired electron-injection/transportation property.

Figure 7E:
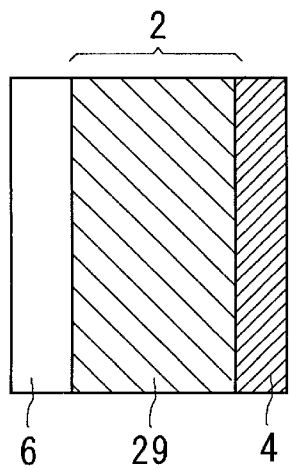

In the structure of FIG. 7E, the light-emitting material layer 2 is formed by a single light-emitting layer 29 having a function of a hole-injection/transportation sublayer and that of an electron-injection/transportation sublayer. If a proper material whose property provides a desired, high hole-injection and hole-transportation efficiency and a desired, high electron-injection and electron-transportation efficiency is used, the light-emitting layer 2 can be made of a simple single-layer structure. Since both the count of sublayers and the kind of materials are single, the fabrication cost can be further lowered. However, practically sufficient light-emitting characteristics have not been obtained so far with the structure of FIG. 7E.

In the structures of FIGS. 7A to 7E, an anode buffer sublayer may be additionally provided between the anode 6 and its adjoining sublayer or layer for the light-emitting material layer 2.

Pixel Structure of Display Device

Figure 8:
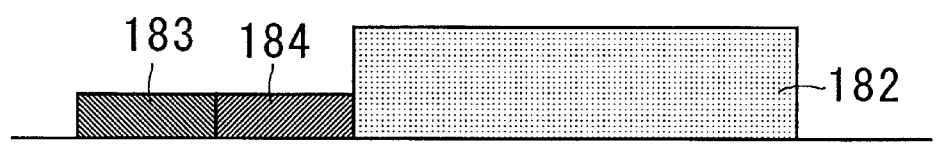
FIG. 8 is a schematic, cross-sectional view showing the configuration of the unit pixel including the organic light-emitting device according to the invention.

FIG. 8 shows the structure of pixels of an organic EL display device, in which each of the pixels includes the light-emitting element according to the invention.

In FIG. 8, a current-supplying element 184 is connected to a light-emitting element 182 according to the invention. A switching element 193 is connected to the element 184. If a signal is supplied to the switching element 183, the element 183 is turned on or off, thereby controlling the current supplied to the element 182 with the element 184.

Pixel Layout of Display Device

Figure 9:
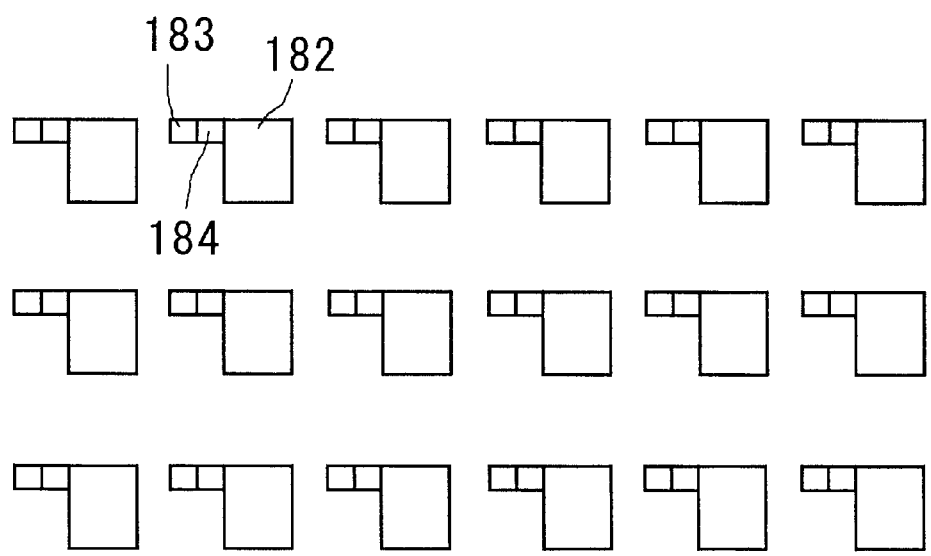
FIG. 9 is a schematic plan view showing the layout of the unit pixels of FIG. 8, in which the pixels are arranged in a matrix array.

FIG. 9 shows the layout of the pixels of FIG. 8 used in the organic EL display device, in which the pixels are arranged in a matrix array. Due to this layout, two-dimensional images can be displayed on the screen. Here, the layout comprises three rows and six columns. However, the count of rows and/or columns may be optionally chosen according to he necessity.

Layout of Light-emitting Element and Wiring Lines of Display Device

Figure 10A:
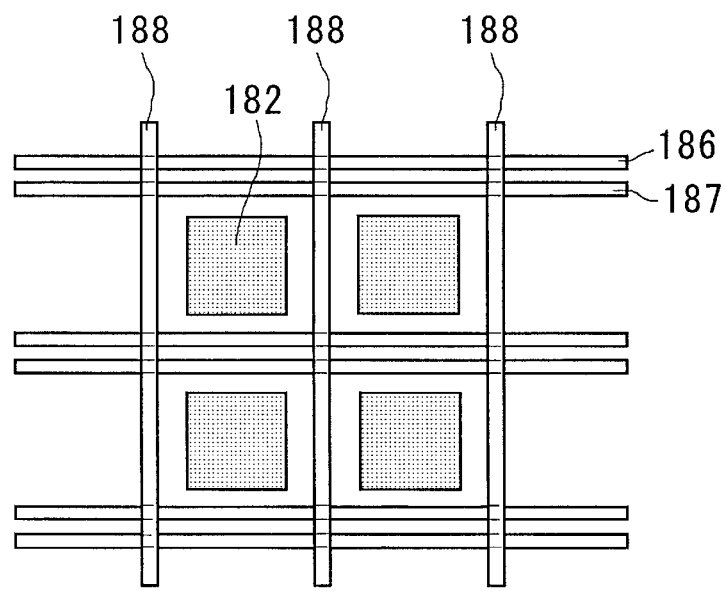
FIGS. 10A and 10B are schematic plan views showing the positional relationship between the light-emitting elements and their wiring lines, respectively.
Figure 10B:
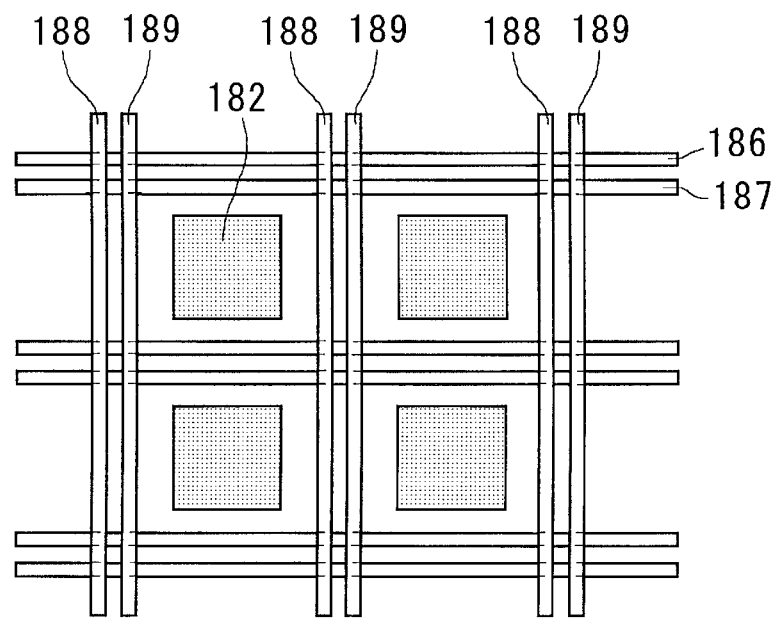

FIGS. 10A and 10B show the layout of the light-emitting elements according to the invention and their wiring lines used in the organic EL display device.

In the layout of FIG. 10A, ground lines 186 and second switching lines 187 are arranged to extend laterally while first switching lines 188 are arranged to extend vertically. The light-emitting elements 182 are arranged in the respective rectangular areas defined by the lines 186, 187, and 188. The elements 182 are connected to a power supply (not shown) by way of current-supplying elements (not shown) The current-supplying elements are connected to switching elements (not shown) The ground lines 186 may be arranged to extend vertically. Here, the layout includes two rows and two columns. However, the count of the row and/or column may be changed optionally according to the necessity.

In the layout of FIG. 10B, ground lines 186 and second switching lines 187 are arranged to extend laterally while first switching lines 188 and current-supplying lines 189 are arranged to extend vertically. The light-emitting elements 182 are arranged in the respective rectangular areas defined by the lines 186, 187, 188, and 189. The elements 182 are connected to the corresponding lines 189 by way of current-supplying elements (not shown). The current-supplying elements are connected to switching elements (not shown). The ground lines 186 may be arranged to extend vertically. The current-supplying lines 189 maybe arranged to extend laterally. Here, the layout includes two rows and two columns. However, the count of the row and/or column may be changed optionally according to the necessity.

Connection of Light-emitting Element with Their Relating Elements and Lines of Display Device Next, the connection of the light-emitting elements 182 according to the invention with the current-supplying elements 184, the switching elements 183, and the first and second switching lines 188 and 187 with reference to FIGS. 11 to 16.

Figure 11:
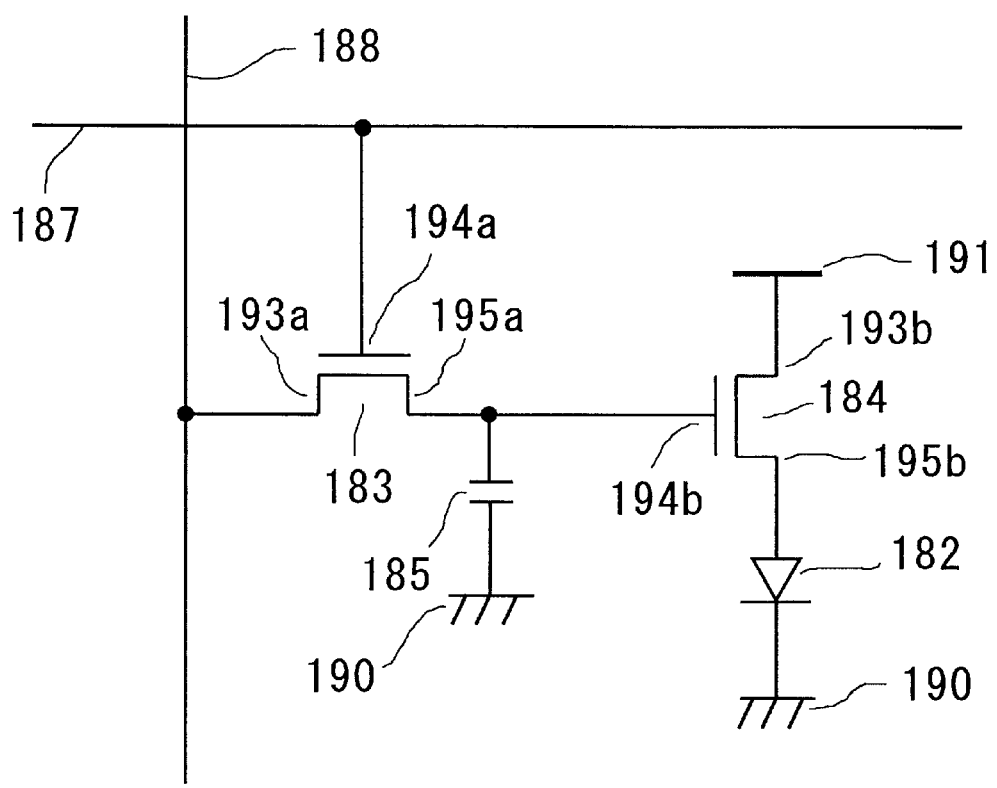
FIG. 11 is an explanatory illustration showing a first example of the electrical connection among the light-emitting element, the current-supplying element, the switching element, and the first and second switching lines.

In the connection of the pixel shown in FIG. 11, the switching transistor 183 is formed by a switching transistor and the current-supplying element 184 is formed by a current-controlling transistor.

As shown in FIG. 11, the first switching line 189 is arranged to extend vertically while the second switching line 187 is arranged extend laterally. The drain 193a and the gate 194a of the element or transistor 183 connected to the first and second switching lines 188 and 187, respectively. The source 195a of the transistor 183 is connected to the gate 194b of the current-supplying element or transistor 184 and one terminal of a voltage-sustaining capacitor 185. The other terminal of the capacitor 185 is connected to the ground 190 The drain 193b and the source 195b of the element or transistor 184 are connected to a current source 191 and the anode of the light-emitting element 192 of the invention, respectively. The cathode of the element 182 is connected to the ground 190.

The circuit of FIG. 11 is operated in the following way.

If a voltage is applied to the second switching line 187, the voltage is applied to the gave 194a of the switching element 183, thereby interconnecting the drain 193a and the source 195a of the element 183 with each other. Then, a voltage is applied to the first switching line 188 in this state, the voltage is applied to the source 195a and thus, electrical charge is stored in the capacitor 185. Thus, even if the voltage applied to the first or second switching line 189 or 187 is turned off, a voltage is continuously applied to the gate 194b of the current-supplying element 184 until the electrical charge stored in the capacitor 185 disappears. As a result, due to the voltage application to the gate 194b of the element 194, the drain 193b and the source 195b communicates with each other to thereby allow an electrical current to flow through the light-emitting element 182 from the current source 191 to the ground. This current flow will cause emission of light from the element 182.

On the other hand, when the driving voltage is not applied to at least one of the first and second switching lines 188 and 187, no electrical charge is stored in the capacitor 185 and no voltage is applied to the gate 194b of the element 184. As a result, no current flows through the light-emitting element 182 and no light is emitted from the element 182.

Figure 12:
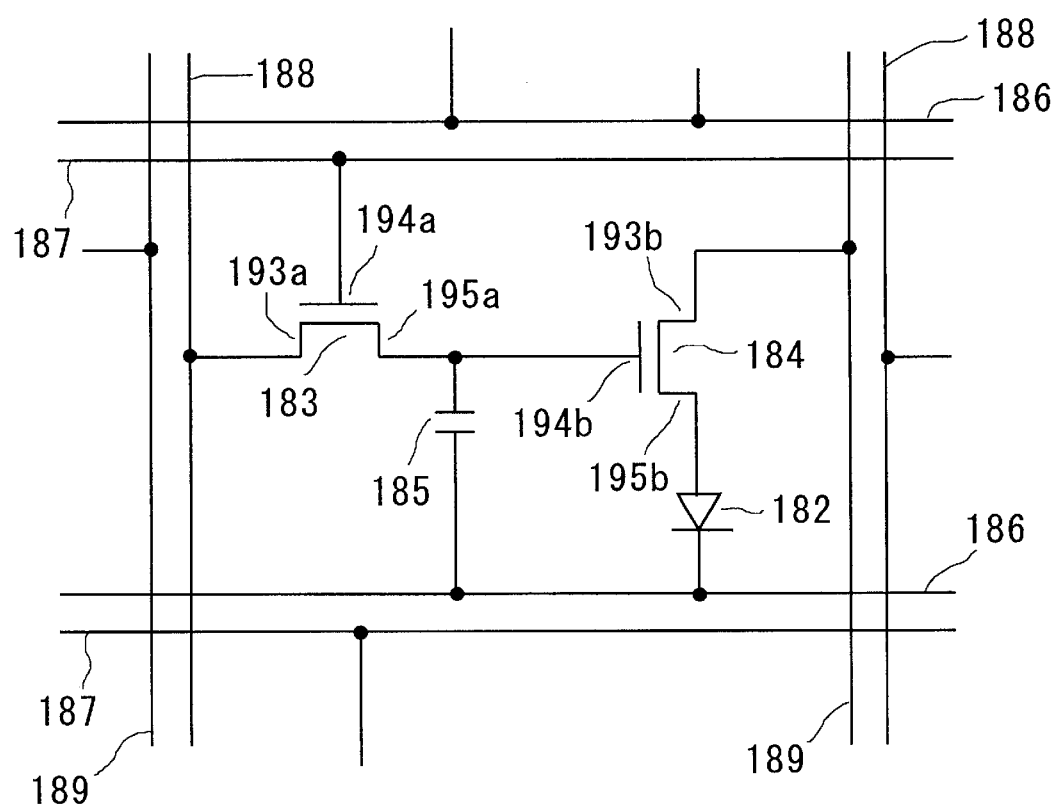
FIG. 12 is an explanatory illustration showing a second example of the electrical connection among the light-emitting element, the current-supplying element, the switching element, and the first and second switching lines.

FIG. 12 shows a variation of the circuit of FIG. 11, in which lateral ground lines 186 and vertical current-supplying lines 189 are additionally provided in the circuit of FIG. 11. The current source 191 is connected to the lines 189 and the ground 190 is connected to the ground lines 186. The operation of the circuit of FIG. 12 is the same as the circuit of FIG. 11.

Figure 13:
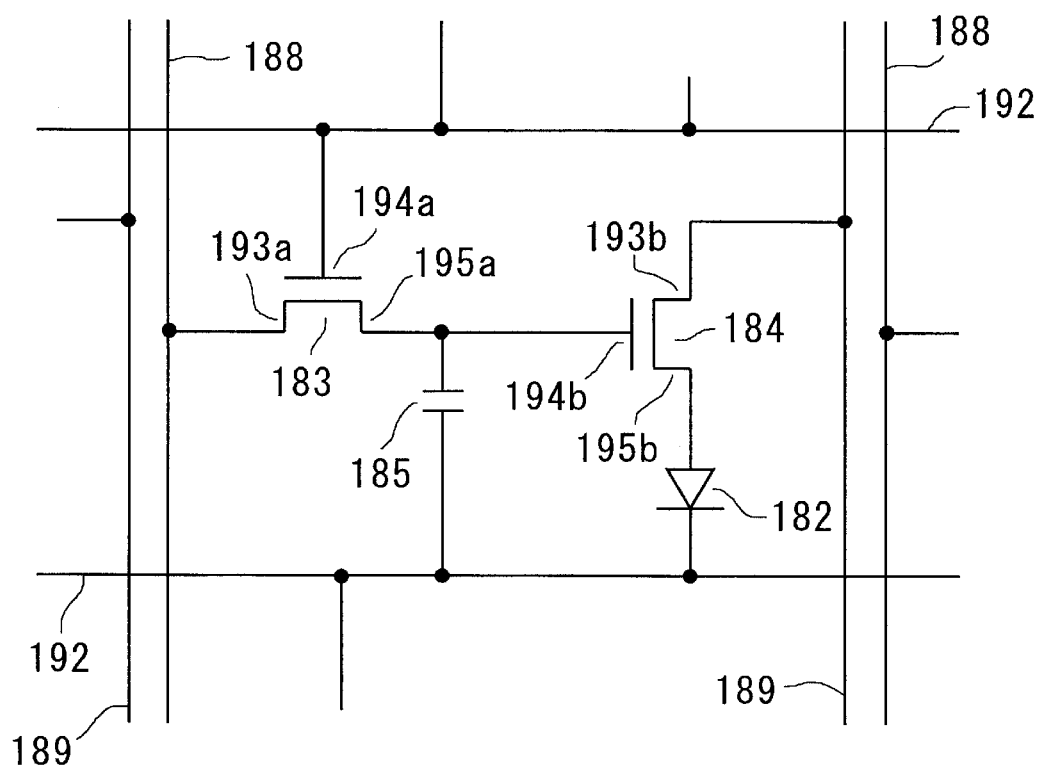
FIG. 13 is an explanatory illustration showing a third example of the electrical connection among the light-emitting element, the current-supplying element, the switching element, and the first and second switching lines.

FIG. 13 shows a variation of the circuit of FIG. 12, in which the second switching line 197 and the ground line 186 are used in common, thereby providing a common line 192. On operation, when the upper common line 192 is applied with a voltage, no voltage is applied to the lower common line 192. Thus, the lines 192 are alternately driven or applied with a voltage in a time-division manner.

Figure 14:
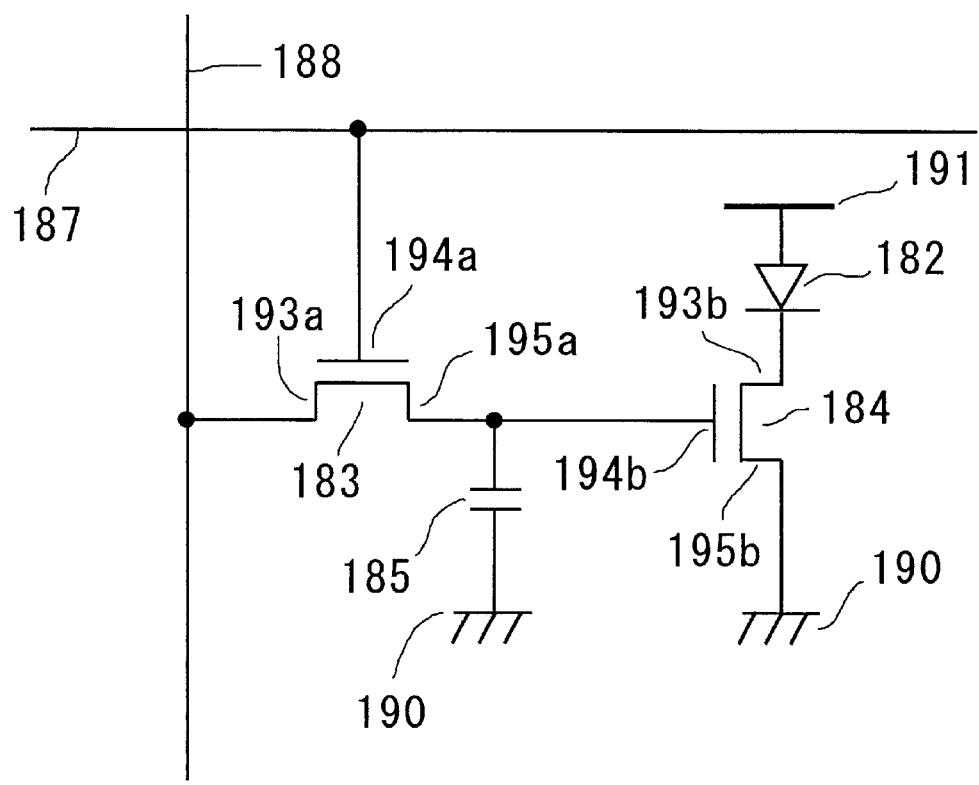
FIG. 14 is an explanatory illustration showing a fourth example of the electrical connection among the light-emitting element, the current-supplying element, the switching element, and the first and second switching lines.

FIG. 14 shows a variation of the circuit of FIG. 11, in which the light-emitting element 182 is changed in position. Since the same reference symbols are attached to the same elements or lines in FIG. 14 as those of FIG. 11, the explanation about the same configuration is omitted for the sake of simplification. In the circuit configuration of FIG. 14, the drain 193b of the current-supplying element 184 is connected to the cathode of the element 182 while the source 195b of the element 184 is connected to the ground 190. The anode of the element 182 is connected to the current source 191. The ground lines and current-supplying liens are eliminated. The operation of the circuit of FIG. 14 is the same as the circuit of FIG. 11.

Figure 15:
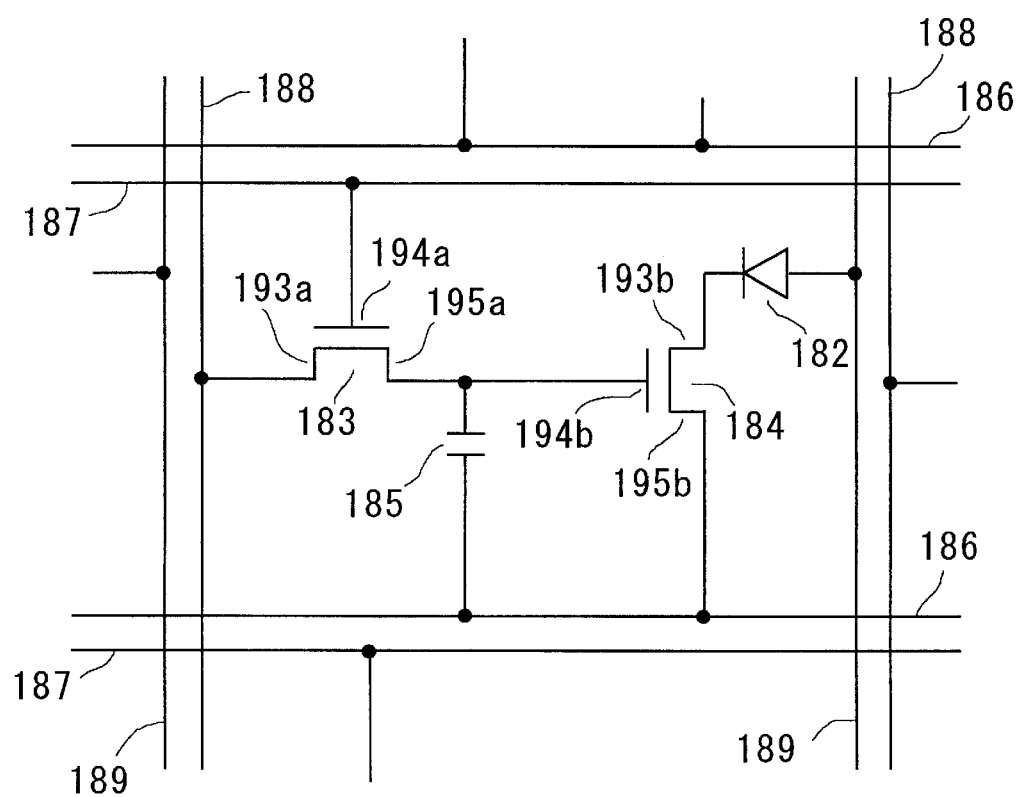
FIG. 15 is an explanatory illustration showing a fifth example of the electrical connection among the light-emitting element, the current-supplying element, the switching element, and the first and second switching lines.

FIG. 15 shows a variation of the circuit of FIG. 14, in which ground lines 186 extending laterally and current-supplying lines 189 extending vertically are additionally provided to the circuit of FIG. 14. The current source 191 is connected to the current-supplying lines 189. The ground 190 is connected to the ground lines 186. The operation of the circuit of FIG. 15 is the same as the circuit of FIG. 14.

Figure 16:
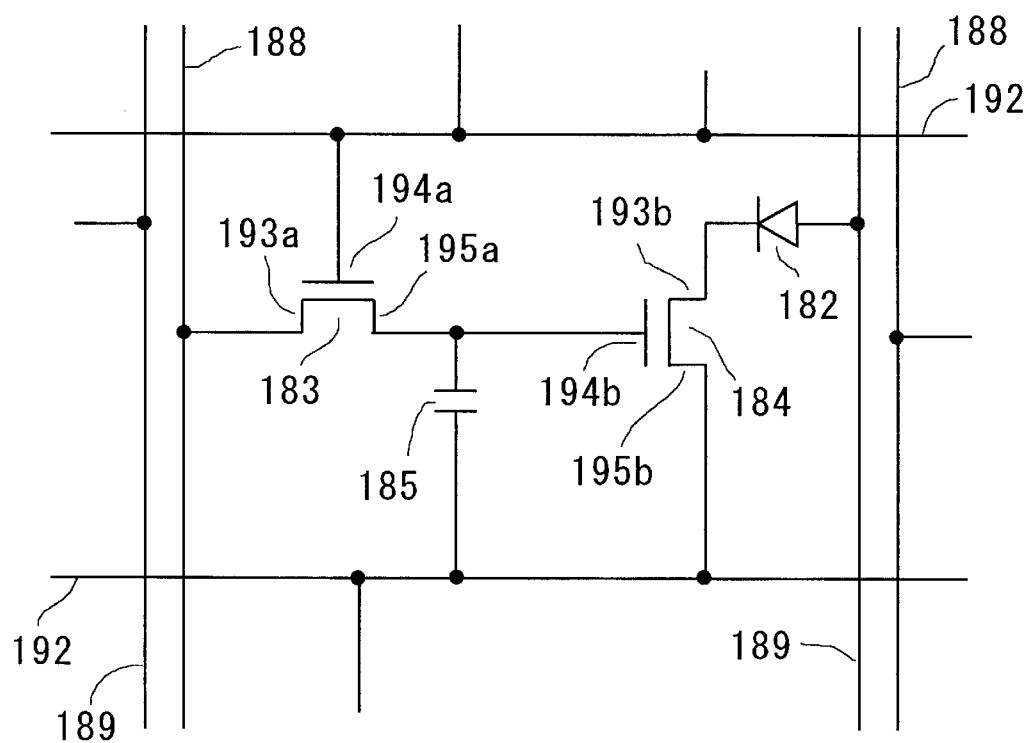
FIG. 16 is an explanatory illustration showing a sixth example of the electrical connection among the light-emitting element of the invention, the current-supplying element, the switching element, and the first and second switching lines.

FIG. 16 shows a variation of the circuit of FIG. 15, in which the second switching line 187 and the ground line 186 are used in common, thereby providing a common line 192 The operation of the circuit of FIG. 16 is the same as the circuit of FIG. 13.

Configuration of Display Device

Figure 17:
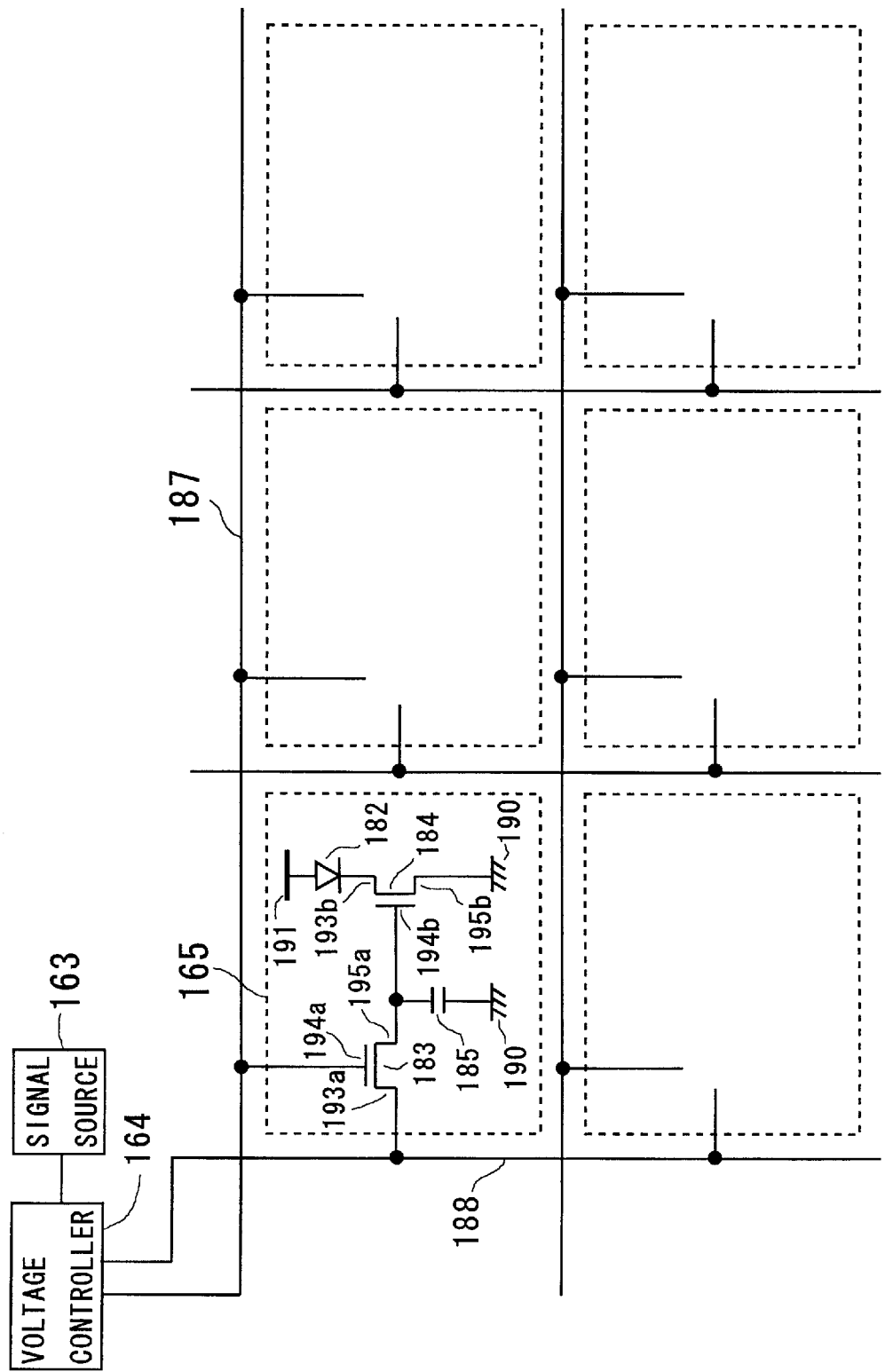
FIG. 17 is a schematic plan view showing the layout of the pixels of the display device, in which each of the pixels includes the light-emitting element of the invention.

FIG. 17 is a schematic view showing the configuration of the display device, in which the pixels 165 each having the light-emitting elements 182 according to the invention are arranged in the form of matrix. Each of the pixels 165 has one of the configurations shown in FIGS. 11 to 16. In FIG. 17, as a typical example, the pixel 165 has the configuration of FIG. 14.

As shown in FIG. 17, the pixel 165 is connected to the vertical first switching line 188 and the lateral second switching line 187. These lines 188 and 187 are connected to a voltage controller circuit 164. The circuit 164 is connected to an image signal source 163. The signal source 163 has a function of converting an electrical signal supplied from a reproducer device for reproducing the image information stored in image-information storage media to an electrical signal in the form applicable to the voltage controller circuit 164, and sending the signal thus converted to the circuit 164. The circuit 164 converts the signal thus sent again and calculates the current value to be supplied to each pixel 165, thereby determining the voltage to be applied to the first and second switching lines 188 and 187, and its the application period and timing. As a result, the display device can display desired images on the screen on the basis of the image information applied color images may be displayed if the adjoining three pixels 165 are designed to generate red-, green-, and blue-based colors.

Concrete, Detailed Structure of Light-emitting Element of the Display Device

Figure 18:
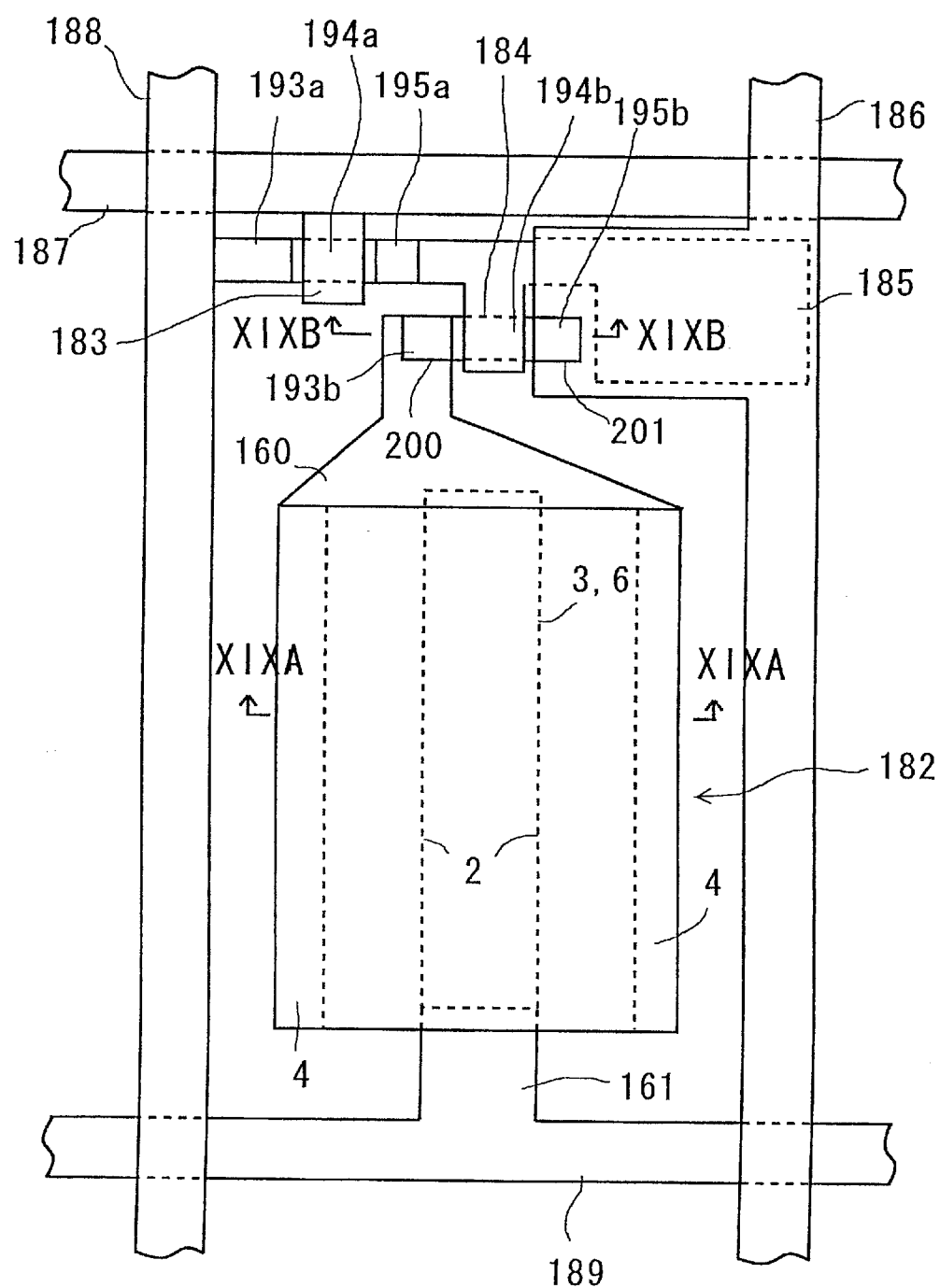
FIG. 18 is a schematic, partial plan view showing the detailed configuration of the pixel of the display device, in which the pixel includes the light-emitting element of the invention.

FIG. 18 shows the structure of the pixel 165 and its neighborhood (which includes the wiring section) of the display device.

The second switching line 187, which serves as the gate line, is connected to the gate 194a of the switching element 183. The fist switching line 188 is connected to the drain 193a of the element 183 The source 194b of the element 183 is connected to the gate 194b of the current-supplying element 184 and the electrode (the lower one) of the voltage-sustaining capacitor 185. The other electrode (the upper one) of the capacitor 185 is connected to the ground line 186. The drain 193b of the element 184 is connected to the cathode 4 of the light-emitting element 182. The light-emitting material layer 2 is formed inside the cathode 4. The anode 6 is formed inside the layer 2. The hole-injection blocking layers 3 are formed on the top and bottom of the anode 6, respectively. The anode 6 is connected to the current-supplying line 189 by way of an electrode-connection line 161.

Figure 19A:
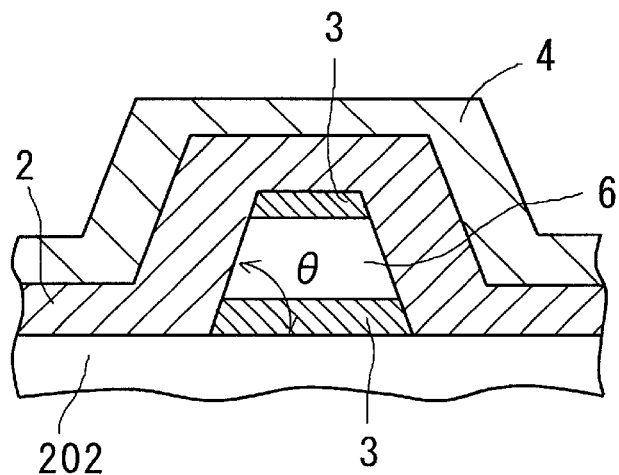
FIG. 19A is a schematic, partial cross-sectional view along the line XIXA—XIXA in FIG. 18

FIG. 19A shows the cross section of the light-emitting element 182 along the line XIXA—XIXA in FIG. 18. On the second interlayer dielectric layer 202 formed on the base 1, the combination of the anode 6 and the two hole-injection blocking layers 3 is formed to have a trapezoidal cross section. The layers 3 are located on the top and bottom of the anode 6, respectively. The inclination angle θ of the anode 6 and the layers 3, which is equal to the inclination angle of the light-emitting material layer 2, is set at a value within the range of 45° to 90°. If the inclination angle θ is less than 45°, the effect by inclination of the light-emitting material layer 2 is too little. The combination of the anode 6 and the upper and lower hole-injection blocking layers 3 is covered with the layer 2. The layer 2 is covered with the cathode 4.

Figure 19B:
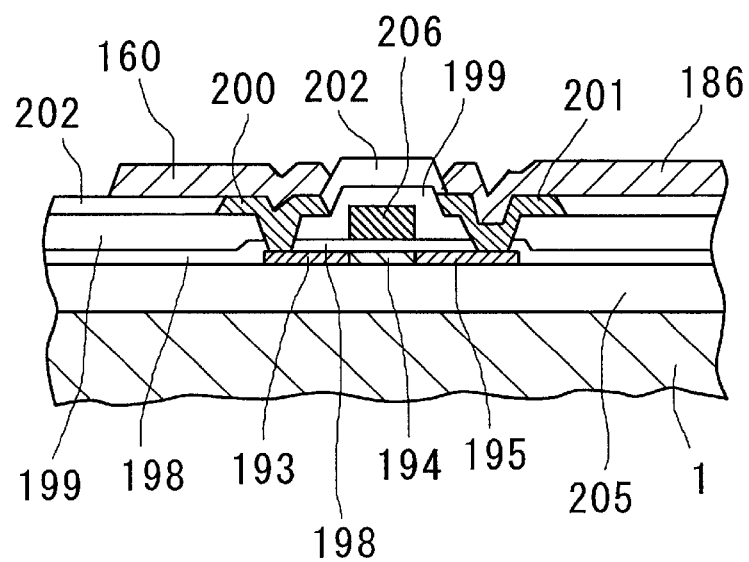
FIG. 19B is a schematic, partial cross-sectional view along the line XIXB—XIXB in FIG. 18

FIG. 19B shows the cross section of the thin-film transistor (TFT) serving as the current-supplying element 184 along the line XIXB—XIXB in FIG. 18.

A barrier layer 205 is formed on the flat surface of the base 1. On the layer 205, a channel region 194, a drain region 193, and a source region 195 of the TFT 184 are formed, as shown in FIG. 19B. A gate dielectric layer 198 is formed on the channel region 194 and the drain and Source regions 193 and 195. A gate electrode 206 is formed on the layer 198 to entirely overlap with the channel region 194. A first interlayer dielectric layer 199 is formed on the gate electrode 206. The parts of the layers 199 and 198 located respectively over the drain and source regions 193 and 195 are selectively removed, thereby forming openings. Drain and source electrodes 200 and 201 are respectively formed in the openings thus formed. A second interlayer dielectric layer 202 is formed to cover the drain and source electrodes 200 and 201. The drain electrode 200 is connected to the electrode line 160 extending over the layer 202. The source electrode 202 is connected to the ground line 186 extending over the layer 202.

Figure 20A:
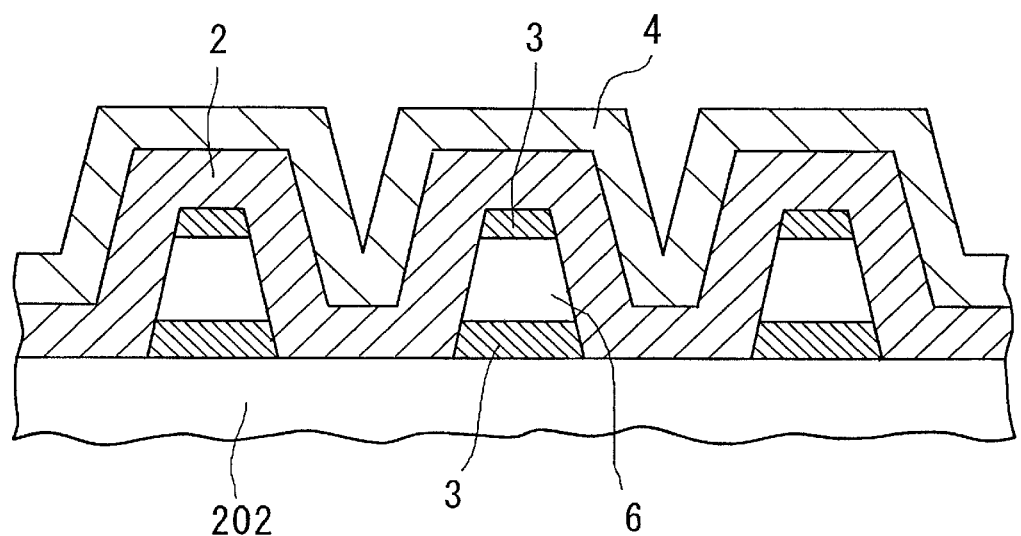
FIG. 20A is a schematic, partial cross-sectional view along the line XXA—XXA in FIG. 20B.
Figure 20B:
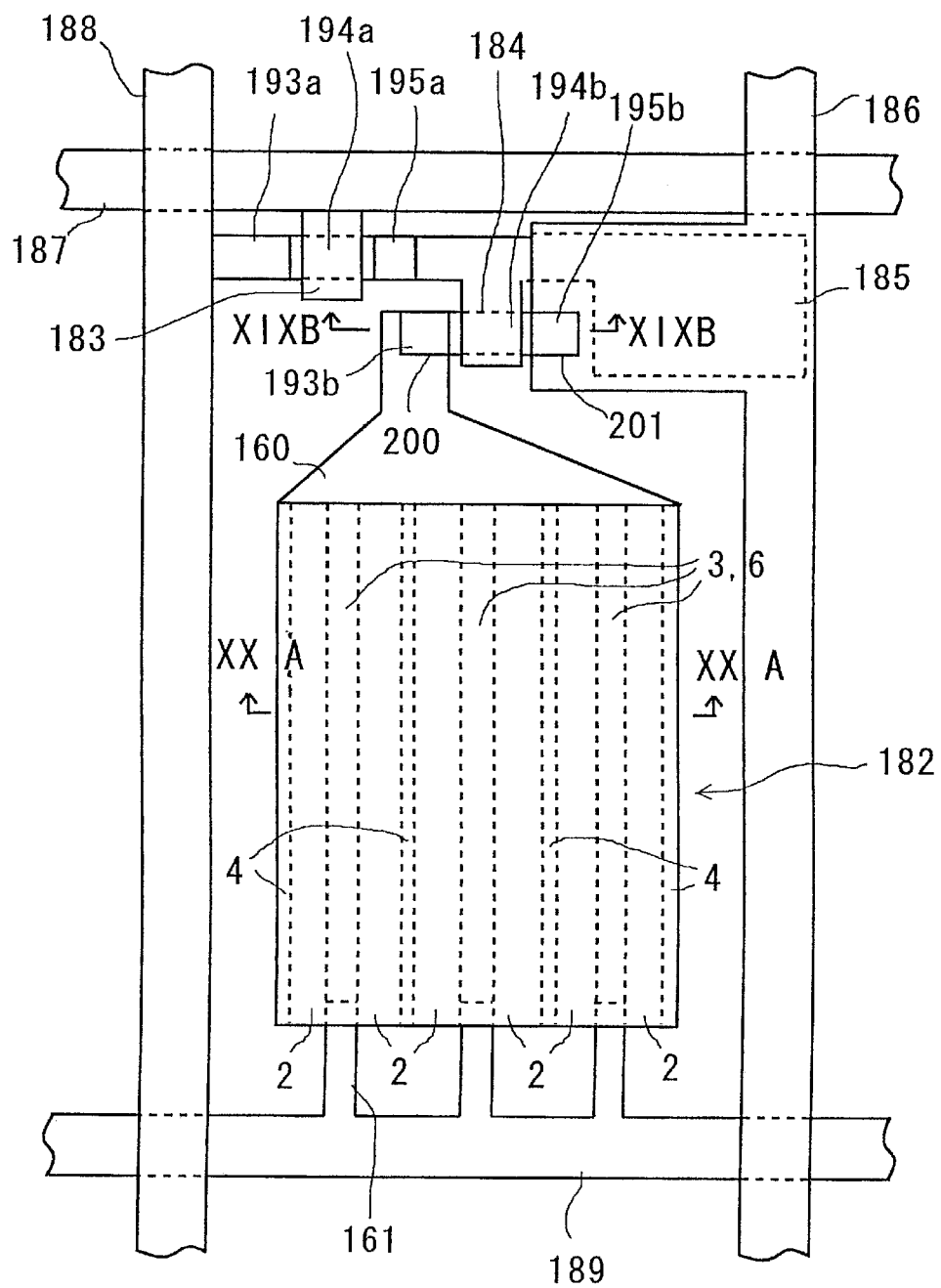
FIG. 20B is a schematic, partial plan view showing the detailed configuration of the pixel of the display device, in which the pixel includes the light-emitting element of the invention.

FIGS. 20A and 20B show a variation of the structure shown in FIGS. 18, 19A and 19B. FIG. 20B is a plan view of the structure and FIG. 20A is a cross-sectional view along the line XXA—XXA in FIG. 20B.

The structure of FIGS. 20A and 20B are the same as that of FIGS. 18, 19A and 19B except that the structure of the light-emitting element of FIG. 19A is divided into three. Therefore, the explanation about the same structure is omitted here. Needless to say, the structure of the light-emitting element of FIG. 19A may be divided into two, four, or more.

Materials for the Light-emitting Element

The cathode 4 may be made of any material if it is conductive and has an electron injection property under application of a voltage. Preferred materials for the cathode 4 are Ti, Al, AlLi, Cu, Ni, Ag, AgMg, Au, Pt, Pd, Ir, Cr, Mo, W, Ta, or the like. The thickness of the cathode 4 is determined in such a way as to provide a desired electron-injection function. For example, preferred thickness is 50 nm to 500 nm, and more preferred thickness is 50 nm to 300 nm. It is preferred that the metallic material for the cathode 4 has a resistivity of $1 \times 10^{-3}$ to $1 \times 10^{-6}$ Ω·cm.

The cathode 4 may be forced by evaporation. However, sputtering is preferred and DC sputtering is more preferred for this purpose. For DC sputtering, the applied power is preferably set at 0.1 to 10 W/cm$^2$, more preferably at 0.5 to 7 W/cm$^2$. The deposition rate is preferably 0.1 to 100 nm/min, and more preferably 1 to 30 nm/min. As the sputtering gas, an inert gas such as Ar, He, Ne, Kr, and Xe, or a mixture of two of these gases is preferred. It is preferred that the pressure of the sputtering gas is approximately 0.1 to 20 Pa.

In the invention, the anode 6 may be made of metal. In this case, a metal having a large work function, such as Au and Ni, may be used for this purpose. The method of forming the anode 6 is the same as those of the cathode 4.

If the anode 6 is made of a transparent conductive layer, it is preferred that the material and thickness of the layer are chosen in such a way that the light to be emitted penetrates the layer at a transmittance of 80% or greater. Concretely, a transparent, conductive oxide is preferably used. For example, preferably, a material containing indium tin oxide (ITO), indium zinc oxide (IZO), indium oxide ($In_2O_3$), tin oxide ($SnO_2$), or zinc oxide (ZnO) as its main constituent. These oxides may be slightly deviated from their stoichiometric compositions. For example, typically, ITO contains $In_2O_3$ and $SnO_2$ to satisfy their stoichiometric compositions. However, the proportion of oxygen may be deviated from its stoichiometric composition. The ratio of $SnO_2$ to $In_2O_3$ is preferably 1 to 20 wt %, more preferably 5 to 12 wt %. The ratio of $ZnO_2$ to $In_2O_3$ is preferably 12 to 32 wt %, more preferably 5 to 12 wt %.

In particular, IZO is preferred for this purpose because of the following reason. Specifically, to improve the reliability of the light-emitting element of the invention, the driving voltage needs to be low. To raise the output efficiency of light of the dame element, the material for the anode 6 needs to be low in resistivity. From this viewpoint, the resistivity of IZO is sufficiently low just after the formation process completed and thus, no heat treatment is required. This means than the element is not damaged due to applied heat during the fabrication processes.

To form the anode 6 made of a transparent, conductive layer, sputtering is preferred. Although RF (radio frequency) sputtering using a RF power supply may be used, DC sputtering is more preferred. This is because DC sputtering has an advantage that the properties of the layer are easily controllable and the obtainable surface of the layer is highly smooth.

With DC sputtering apparatuses to be used for forming a transparent, conductive layer, a magnetron DC sputtering apparatus is preferably used. In this case, the magnetic flux density just over the target is preferably 500 to 2000 gauss (i.e., 0.05 to 0.2 T). More preferably, it is 800 to 1500 gauss (i.e., 0.08 to 0.15 T). It is preferred that the magnetic flux density just over the target is as high as possible. If the electrode structure is designed in such a way to confine electrons in the vicinity of the target, and the magnetic-field intensity is raised by increasing the magnetic flux density, the number of ions existing in the sputtering gas in plasma to collide with the cathode target is increased and as a result, the plasma density is raised. If so, the collision frequency among the particles in the plasma increases and part of the kinetic energy of the particles is lost. Thus, the particles thus sputtered will he deposited on the base 1 obliquely.

To generate a desired magnetic field over the sputtering target, any method may be used. Preferably, a magnet is located on the backside of the target. More preferably, the magnet is placed in the cooling section of the sputtering apparatus. As the magnet, for example, a Fe—Nd—B, Sm—Co, ferrite, or alnico magnet is preferably used. Preferably, a Fe—Nd—B or Sm—Co magnet is used.

The bias voltage across the target and the substrate or base is preferably 100 to 300 V, more preferably 150 to 250 V. If the bias voltage is too high, the acceleration of the particles is large and as a result, the anode layer is likely to be damaged. On the other hand, if the bias voltage is too low, plasma discharge is difficult to be kept, or the plasma density is too low and the above effect is difficult to be obtained. Additionally, it is preferred that both the magnetic-field intensity and the bias voltage are respectively adjusted within the above-described ranges according to the situation or condition to be used and the scale of the apparatus.

The power of the DC sputtering apparatus is preferably set at 0.1 to 10 W/cm$^2$, more preferably, 0.5 to 7 W/cm$^2$. The deposition or sputtering rate is preferable 5 to 100 nm/min, more preferably 10 to 50 nm/min. In relation to the other sputtering conditions, any typical gas pressure (for example, 0.1 to 0.5 Pa) and any typical value of the substrate (base)-target distance (for example, 4 to 10 cm) are acceptable.

As the sputtering gas, any inert gas, which is used for conventional sputtering apparatuses, may be used. In addition, any reactive gas, such as $N_2$, $H_2$, $O_2$, $C_2H_4$, or $NH_3$, maybe used. Preferably, Ar, Kr, or Xe, or a gaseous mixture containing at least one of Ar, Kr, and Xe is used. This is because these gases are inert and have a comparative large atomic weight. More preferably, Ar, Kr, or Xe is used.

If Ar, Kr, or Xe is used as the sputtering gas, the sputtered atoms collide with the gas molecules repeatedly until they reach the substrate or baser thereby decreasing the kinetic energy of the sputtered atoms. For this reason, there is an additional advantage that the kinetic energy applies less physical damages to the structure of the light-emitting device.

If a gaseous mixture that contains at least one of Ar, Kr, and Xe is used, the total partial pressure of Ar, Mr, and/or Xe is preferably 50% or greater. This mixture is used as the main sputtering gas. In this case, reactive sputtering can be performed while keeping the effect of the invention.

It is sufficient that the anode 6 has a thickness equal to or greater than a specific value that ensures desired hole-injection and hole-transportation functions. A preferred thickness range is 50 to 500 nm. A more preferred thickness range is 50 to 300 nm. If the thickness is too large, there is a possibility that the anode 6 is likely to separate. If the thickness is too small, there is a possibility that the strength and hole-transportation capability of the anode 6 are likely to be insufficient.

Next, the organic material sublayers used for the light-emitting device of the invention (see FIGS. 7A to 7E) are explained below.

The light-emitting sublayer 21 has the functions of injecting holes or electrons, transporting the holes or electrons thus injected, and recombining the holes and electrons to thereby generate excitons. It is preferred that the material for the sublayer 21 is a comparatively electronically neutral compound.

The hole-injection/transportation sublayer 20 has the functions of facilitating injection of holes from the anode 6, transporting stably the holes thus injected, and preventing electrons from being injected. The electron-injection/transportation sublayer 22 has the functions of facilitating injection of electrons from the cathode 4, transporting stably the electrons thus injected, and preventing holes from being injected. These sublayers 20 and 22 are used to increase the holes or electrons to be injected into the light-emitting sublayer 21, to confine the same, to optimize the recombination region, and to improve the light-emission efficiency.

The thicknesses of the light-emitting sublayer 21, the hole-injection/transportation sublayer 20, and the electron-injection/transportation sublayer 22 are not limited to any range. The thicknesses of the sublayers 21, 20, and 22 vary dependent on the formation method used. Typically, these thicknesses are preferably 5 to 500 nm, and more preferably 10 to 300 nm The thicknesses of the sublayers 20 and 22 are typically ($\frac{1}{10}$) to 10 times as much as the thickness of the sublayer 21, which vary according to design of the recombination and light-emitting region.

If the hole-injection/transportation sublayer 20 is replaced with the hole-injection sublayer 23 and the hole-transportation sublayer 24, the sublayer 23 is preferably 1 nm or greater in thickness and the sublayer 24 is preferably 1 nm or greater in thickness. In this case, typically, the upper limit of the thicknesses of the sublayers 23 and 24 is approximately 500 nm. These relationships about the thickness of the sublayers 23 and 24 are kept the same when two hole-injection/transportation sublayers 20 are formed.

If the electron-injection/transportation sublayer 22 is replaced with the electron-injection sublayer 25 and the electron-transportation sublayer 26, the sublayer 25 is preferably 1 nm or greater in thickness and the sublayer 26 is preferably 1 nm or greater in thickness. In this case, typically, the upper limit of the thicknesses of the sublayers 25 and 26 is approximately 500 nm. The relationships about the thickness of the sublayers 25 and 26 are kept the same when two hole-injection/transportation sublayers 22 are formed.

The light-emitting sublayer 21 contains a fluorescent material as a compound with a light-emitting function. As the fluorescent material, for example, the compositions disclosed in the Japanese Non-Examined Patent Publication No. 63-264692 published in 1988, e.g., quinacridon, rubrene, and/or styryl-system pigments, may be used. Moreover, quinoline derivative such as metal complex pigment containing 8-quinolinol such as tris(8-quinolinolat) aluminum and its derivative as its ligand, tetraphenylbutadiene, anthracene, perylene, coronene, and 12-phthaloperinone derivatives may be used. Phenylanthracene disclosed in the Japanese Patent Application No. 6-110569 or tetraarylethene derivatives disclosed in the Japanese Patent Application No. 6-110569 may be used.

It is preferred that the fluorescent material is used with a host material that emits light voluntarily, in particular, used as a dopant. In this case, the content of the compound in the light-emitting sublayer 21 is preferably 0.01 to 10 wt %, more preferably 0.1 to 5 wt %. If the fluorescent material is used with the host material, the wavelength characteristic of emitted light can be changed. As a result, the wavelength of light can be shifted toward the longer wavelength side and at the same time, the emission efficiency and stability of light can be improved.

As the host material, a quinolinolat complex is preferred, and an aluminum complex that contains 8-quinolinolat or its derivative as its ligand is more preferred. Aluminum complexes of this type are disclosed in the Japanese Non-Examined Patent Publication Nos. 63-264692 published in 1958, 3-255190 published in 1991, 5-70733 published in 1993, 5-258859 published in 1993, and 6-215874 published in 1994.

Concrete examples of the quinolinolat complex are
tris(8-quinolinolat)aluminum,
bis (8-quinolinolat)magnesium,
bis(benzo{f}-8-quinolinolat)zinc,
bis(2-methyl-8-quinolinolat)aluminum-oxido,
tris (8-qinolinolat) indium,
tris(5-methyl-quinolinolat)aluminum,
8-quinolinolat-lithium,
tris(5-chloro-8-quinolinolat) galium,
bis(5-chloro-8-quinolinolat)calcium,
5,7-dichlor-8-quinolinolat-aluminum,
tris(5,7-dibromo-8-hydroxyquinolinolat)aluminum, and
poly[zinc(II)-bis(8-hydroxyquinolinolat)methane].

Concrete examples of the aluminum complexes containing a ligand other than 3-quinolinol and its derivatives are
bis(2-methyl-8-quinolinolat)(fenolat)aluminum (III),
bis(2-methyl-8-quinolinolat)(ortho-cresolat)aluminum(III),
bis(2-methyl-8-quinolinolat)(metha-cresolat)aluminum(III),
bis(2-methyl-8-quinclinolat)(para-cresolat)aluminum(III),
bis(2-methyl-8-quinolinolat)(ortho-phenylphenolat) aluminum(III),
bis(2-methyl-8-quinolinolat)(metha-phenylphenolat) aluminum(III),
bis(2-methyl-8-quinolinolat)(para-phenylphenolat) aluminum(III),
bis(2-methyl-8-quinolinolat)(2,3-dimethylphenolat) aluminum(III),
bis(2-methyl-8-quinolinolat)(2,6-dimethylphenolat) aluminum(III),
bis(2-methyl-8-quinolinolat)(3,4-dimethylphenolat) aluminum(III),
bis(2-methyl-8-quinolinolat)(3,5-dimethylphenolat) aluminum(III),
bis(2-methyl-8-quinolinolat)(3,5-ditert-bythylphenolat) aluminum(III),
bis(2-methyl-8-quinolinolat)(2,6-diphenylphenolat) aluminum(III),
bis(2-methyl-8-quinolinolat)(2,4,6-triphenylphenolat) aluminum(III),
bis(2-methyl-8-quinolinolat)(2,3,6-trimethylphenolat) aluminum(III),
bis(2-methyl-8-quinolinolat)(2,3,5,6-tetramethylephenolat) aluminum(III),
bis(2-methyl-8-quinolinolat)(1-naphtholat)aluminum(III),
bis(2-methyl-8-quinolinolat)(2-naphtholat)aluminum(III),
bis(2,4-dimethyl-8-quinolinolat)(ortho-phenylphenolat) aluminum(III),
bis(2,4-dimethyl-8-quinolinolat)(para-phenylphenolat) aluminum(III),
bis(2,4-dimethyl-8-quinolinolat)(metha-phenylphenolat) aluminum(III),
bis(2,4-dimethyl-8-quinolinolat)(3,5-dimethylphenolat) aluminum(III),
bis(2,4-dimethyl-8-quinolinolat)(3,5-ditert-buthylphenolat) aluminum(III),
bis(2-methyl-4-ethyl-8-quinolinolat)(para-closolat) aluminum(III),
bis(2-methyl-4-methoxy-8-quinolinolat)(para-phenylphenolat)aluminum(III),
bis(2-methyl-5-cyano-8-quinolinolat)(ortho-closolat) aluminum(III), and
bis(2-methyl-6-trifluoromethyl-8-quinolinolat)(2-naphtolat) aluminum(III).

In addition, the following may be used.
bis(2-methyl-8-quinolinolat)aluminum(III)-$\mu$-oxo-bis(2-methyl-8-quinolinolat)aluminum(III),
bis(2,4-dimethyl-8-quinolinolat)aluminum(III)-$\mu$-oxo-bis (2,4-dimethyl-8-quinolinolat)aluminum(III),
bis(4-ethyl-2-methyl-8-quinolinolat)aluminum(III)-$\mu$-oxo -bis(4-ethyl-2-methyl-8-quinolinolat)aluminum(III),
bis(2-methyl-4-methoxylinolat)aluminum(III)-$\mu$-oxo-bis(2-methyl-4-methoxylinolat)aluminum(III),
bis(5-ciano-2-methyl-8-quinolinolat)aluminum(III)-$\mu$-oxo -bis(5-ciano-2-methyl-8-quinolinolat)aluminum(III), and
bis(2-methyle-5-trifluolomethyl-8-quinolinolat)aluminum (III)-$\mu$-oxo-bis(2-methyle-5-trifluolomethyl-8-quinolinolat)aluminum(III).

The other host materials applicable to this purpose are phenylanthracene derivatives disclosed in the Japanese Non-Examined Patent Publication No. 6-110569 published in 1994 and tetraarylethene derivatives disclosed in the Japanese Non-Examined Patent Publication No. 6-114456 published in 1994.

The light-emitting sublayer 21 may serve as the electron injection/transportation sublayer 22. In this case, tris(8-quinolinolat)aluminum or the like is preferably used. These fluorescent materials are simply evaporated.

According to the necessity, the light-emitting sublayer 21 may be made of a mixture of at least one hole-injection/transportation compound and at least one electron-injection/transportation compound. This mixture contains preferably a dopant. Preferably, the content of each compound in the mixture is preferably 0.1 to 20 wt %, more preferably 0.1 to 15 wt %.

With the mixture of at least one hole-injection/transportation compound and at least one electron-injection/transportation compound, hopping conduction paths of carriers are formed. Therefore, holes and electrons are likely to move inside the materials preferable to their own polarities. Electrons are difficult to be injected to the material preferable to holes, and vice versa. This means that the organic material is difficult to be damaged and thus, there is an advantage that the light-emitting device has an extended lifetime. Moreover, since the mixture is doped with the above-described dopant, the wavelength characteristic of light of the mixture can be changed, thereby shifting the emission wavelength to the longer wavelength side. The intensity of the light emission can be raised and the device stability can be improved.

The compounds for hole-injection and hole-transportation and for electron-injection and electron-transportation to be used for the above-described mixture may be chosen from the compounds for the hole-injection/transportation sublayer 20 and the compounds for the electron/transportation sublayer 22 which are explained later.

As the compounds for hole-injection and hole-transportation, preferably, quinoline derivatives or metal complexes containing 8-quinolinol and its derivative as its ligand are used. In particular, tris(8-quinolinolat)aluminum ($Alq_3$) is more preferred. Phenylanthracene derivatives or tetraarylethene derivatives may be used for this purpose.

As the compounds for electron-injection and electron-transportation, preferably, amine derivatives with strong fluorescence are preferably used. For example, triphenyldiamine derivatives, styrylamine derivatives, or amine derivatives having fused aromatic rings are preferred. The mixing ratio is determined in such a way as to take the carrier mobility and the carrier concentration into consideration. In general, it is preferred that the weight ratio of the hole-injection/transportation compound to the electron-injection/transportation compound is approximately 1/99 to 99/1, more preferably, approximately 10/90 to 90/10, most preferably) approximately 20/80 to 80/20.

The thickness of the mixture layer is preferably a value corresponding to one layer of molecules or greater; however, it is preferably less than the thickness of the organic layers. Concretely, 1 to 85 nm is preferred, 5 to 60 nm is more preferred, and 5 to 50 nm is most preferred.

Preferred formation method of the mixture layer is co-evaporation where the constituent compounds of the mixture are evaporated simultaneously from different evaporation sources. However, if the vapor pressures (evaporation temperatures) of the compounds are approximately equal or very close to each other, evaporation source materials may be mixed together in an evaporation boat in advance and then, the mixture may be evaporated. It is preferred that the compounds of the mixture are uniformly mixed. However, the compounds may be distributed to form islands. In general, the light-emitting sublayer 21 is formed to have a specific thickness by evaporating an organic fluorescent material, or by dispersing the material in a binder and then, coating the binder containing the material.

As the material for the hole-injection/transportation sublayer 20, the organic compounds disclosed in the Japanese Non-Examined Patent Publication Nos. 63-295695 published in 1988, 2-191694 published in 1990, 3-792 published in 1991, 5-234681 published in 1993, 5-239455 published in 1993, 5-299174 published in 1993, 7-126225 published in 1995, 7-126226 published in 1995, 8-100172 published in 1996, and the European Patent Publication No. 0650955A1 may be used. For example, tetraarylbenzidine compound (triaryldiamine or triphenyldiamine: TPD), aromatic third-grade amine, hydrazone derivatives, carbazole derivatives, triazole derivatives, imidazole derivatives, oxadiazol derivatives, and polythiophene may be used. Two or more of these compounds may be used together. In this case, preferably, they are stacked in the form of separate layers or mixed together to form a layer of the mixture.

If the hole-injection/transportation sublayer 20 is replaced with the hole-injection sublayer 23 and the hole-transportation sublayer 24, the materials for the hole-injection/transportation sublayer 20 may be properly assembled. In this case, the compounds are preferably arranged in such a way that their ionization potential values are aligned in the ascending order from the side of the anode 6 (which is made of ITO or the like) toward the cathode 4. This is applicable to the case where two or more hole-injection/transportation sublayers 20 provided. Because of this stacking order, the driving voltage lowers and at the same time, the generation of electric current leakage and the generation and growth of dark spots are prevented. Moreover since evaporation method in applicable, thin layers with a small thickness of approximately 1 to 10 nm can be formed uniformly and pin-hole free. Thus, even it a compound having a low ionization potential and absorption in the visible range is applied to the hole injection sublayer 23, the change of color tone of emitted light and the decrease of the efficiency due to reabsorption can be prevented. The hole-injection/transportation sublayer 20 may be formed by evaporating the above-described compounds in the same way as the light-emitting sublayer 21.

As the material for the electron-injection/transportation sublayer 22, which is provided according to the necessity, quinoline derivatives, such as metal complexes containing 8-quinolinol and its derivative as its ligand are used. In particular, tris(8-quinolinolat)aluminum ($Alq_3$) is more preferred. Alternately, oxadiazol derivatives, perylene derivatives, pyridine derivatives, pyrimidine derivatives, quinoxaline derivatives, diphenylquinone derivatives, nitro-replaced fluorine derivatives may be used. The electron-injection/transportation sublayer 22 may serve as the light-emitting sublayer 21. In this case, tris (8-quinolinolat) aluminum ($Alq_3$) or the like is preferably used. The formation of the sublayer 22 may be conducted in the same way as the sublayer 21.

If the electron-injection/transportation sublayer 22 is replaced with the electron-injection sublayer 25 and the electron-transportation sublayer 26, the materials for the electron-injection/transportation sublayer 22 may be properly assembled. In this case, the compounds are preferably arranged in such a way that their electron affinity values are aligned in the descending order from the side of the cathode 4 toward the anode 6. This is applicable to the case where two or more electron-injection/transportation sublayers 22 are provided.

Furthermore, as described in the book entitled "Organic EL elements and the front of their industrialization", published by NTS publication Co. Ltd, pp. 48–49, pp. 69–70, and pp. 86–89, polymer light-emitting materials containing the precursor of a conjugate organic polymer compound and at least one fluorescent substance may be used for the light-emitting sublayer 21. As the precursor, polyparaphenylenevinylene derivatives, such as PPV (polyparaphenylenevinylene), Ro-PPV, CN-PPV, MEH-PPV, and DMOS-PPV; polythiophene derivatives, such as PAT, PCHMT, POPT, PTOPT, PDCHT, PCHT, and POPT; polyparaphenylene derivatives, such as RO-PPP, FP-PP;, and PDAF; polyshiran derivatives, such as PMPS, PPS, PMrPrS, PNPS, and PBPS; polyacetylene derivatives, such as PAPA and PDPA; the other derivatives, such as PdPhQx, PQx, PVK, PPD; may be used.

Moreover, the following material may be added to these precursors. Specifically, Perylene, Qd-1, Coumarine 6, Qd-3, Qd-2, DCM1, BCzVBi, Rubrene, TPP, DCM2, Coumarine540, Rhodamimne6G, Quinacridone, Sq, Pyazoline, Decacyclene, Phenozazone, and pigment (e.g., Eu).

The material for the base or substrate 1 is not limited. It may be optionally chosen according to the materials of the conductive layers to be stacked or the like. For example, metal (e.g., Al), transparent or semi-transparent materials such as glass, quartz, and resin, may be used. The material may be opaque. In this case, in addition to glass, ceramics (e.g., alumina), metal sheet (e.g., stainless steel) having surface insulating treatment (e.g., surface oxidation), and thermosetting resin (phenol resin), thermoplastic resins (e.g., poly carbonate) may be used.

The light-emitting element according to the invention is typically used as a DC-driven EL element or device. However, it may be AC-driven or pulse-driven. The voltage to be applied is usually 5 to 20V.

As the material for the anode buffer layer, copper phthalocyanine (CuPc), star-burse (typically, m-MTDATA) or polymer-allylamine may be used in the materials having low molecular weight. The layer made by applying Lewis acid to triphenyleamine derivative to thereby generate radical cations for improving conductivity may be used. In the materials having high molecular weight, conductive polymers such as polyaninline (PAni) and polythiophene may be used. The anode buffer layer tan be formed by evaporating the above-described compound like the light-emitting sublayer 21.

As the material for the switching element or the current-supplying element, any transistor or transistor-based element may be used.

As the material for the switching lines, the current-applying lines, the second switching lines, the common wiring lines, or the ground lines, Al, Cu, Ta, Ru, or WSi may be used. The preferred formation method of them is sputtering, evaporation, or CVD.

The source, drain and gale electrodes of the switching and current-controlling transistors may be made of Al, Cu, Ta, Ru, or WSi. The preferred formation method of them is sputtering, evaporation, or CVD.

The gate insulating layer the first interlayer dielectric layer, the second interlayer dielectric layer, and the barrier layers may be made of oxide or nitride of Al, or oxide or nitride of Si.

As the materials for the hole-injection blocking sublayer and the electron-injection blocking sublayer, inorganic or organic dielectric material may be effectively used. However, the invention is not limited to this. Any material having a high barrier function or property against holes or electrons may be used for this purpose. For example, as the hole-injection blocking sublayer, metal may be used if it has a work function approximately equal to or less than that of the light-emitting sublayer 21. If the anode 6 is formed by a transparent conductive layer (e.g., ITO), the outputting efficiency or light of he device can be improved by forming the hole-injection blocking layer with a metal having high reflectance (e.g., Al or Al alloy).

Method of Fabricating the Light-emitting Element and its Driver Circuit

Next, a typical method of fabricating the light-emitting element according to the invention and its driving circuit (in FIGS. 18, 19A and 19B) is explained below with reference to FIGS. 22, 23A, 23B, 24A, 24B, 25A, and 25B.

Figure 21A:
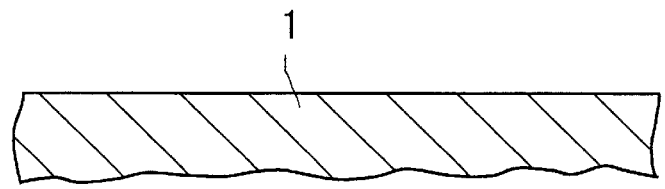
FIGS. 21A to 21I are schematic, partial cross-sectional views showing a method of fabricating the light-emitting element of the invention and its driving circuit, respectively.
Figure 21B:
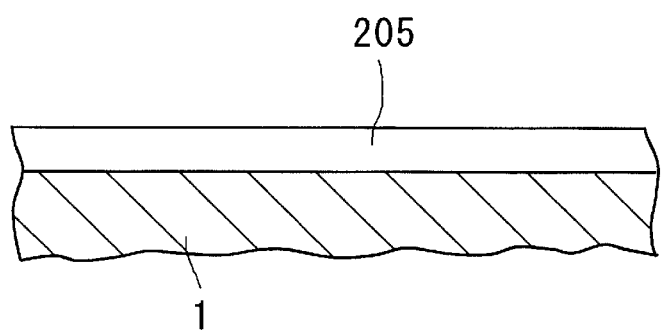
Figure 21C:
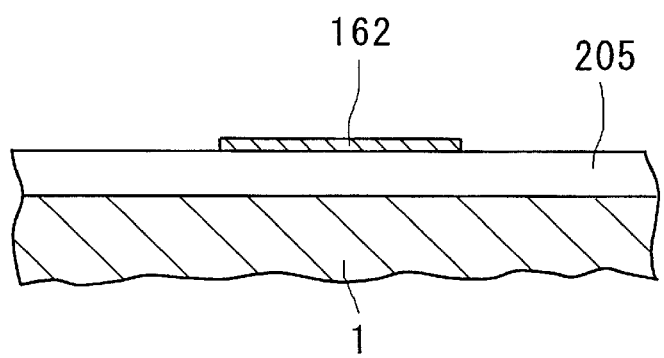

First, the base or substrate 1 is prepared, as shown in FIG. 21A. Typically, the base 1 is made of no-alkali glass. Then, on the flat surface of the base 1, a barrier layer 205 is formed by a sputtering or CVD method, as shown in FIG. 21B. On the barrier layer 205 thus formed, a silicon (Si) layer 162 is selectively formed to cover the Si layer 162 by a sputtering or CVD method, as shown in FIG. 21C. Typically, the Si layer 162 is formed by a Low-Pressure CVD method at a temperature of approximately 500° C. and then the layer 162 is polycrystallized by irradiating laser light.

Figure 21D:
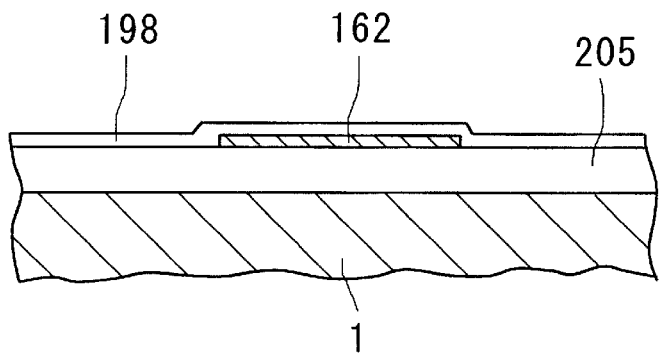
Figure 21E:
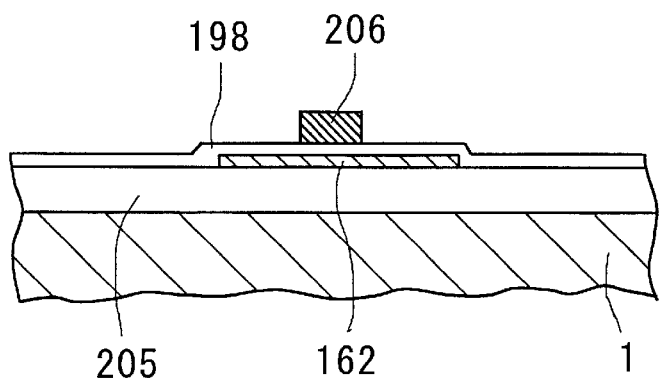

Subsequently, a gate dielectric layer 198 is formed on the barrier layer 205 to cover the polycrystallized Si layer 162 by a sputtering or CVD method, as shown in FIG. 21D. Typically, the layer 198 is formed by depositing silicon dioxide ($SiO_2$) by a remote plasma-enhanced CVD method.

On the gate dielectric layer 199, a patterned gate electrode 206 is formed. For example, a conductive layer (typically, a WSi layer) by a sputtering or evaporation method and then, a photoresist film is formed on the conductive layer by a spin-coating method. Thereafter, using an optical mask, the photoresist film is exposed to light and developed, thereby patterning the photoresist film as desired. Using the photoresist film thus patterned as a mask, the underlying conductive layer is selectively removed by an ion milling method. Finally, the photoresist film is removed by dissolving it into a proper solvent. In this process, although not shown, the lower electrode of the voltage-sustaining capacitor 185 is formed at the extended part of the gate electrode 206. The state at this stage is shown in FIG. 21 E.

Figure 21F:
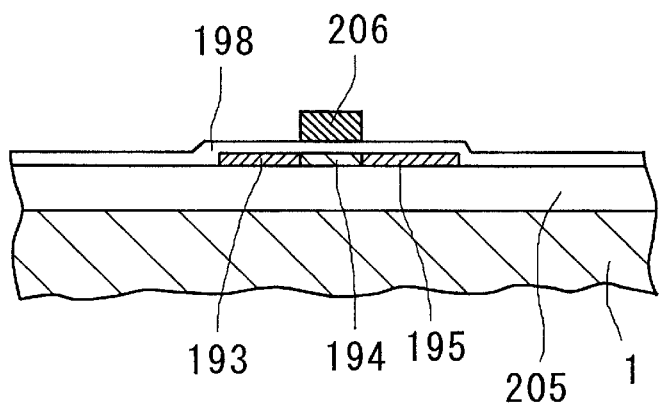

Following this, after the specific area except for the Si layer 162 is covered with a photoresist film, a dopant (boron or phosphorus) is selectively doped into the layer 162 and a heat treatment is applied to the layer 162 at approximately 550° C. Thus, a drain region 193 and a source region 195 are formed in the layer 162. The undoped region of the layer 162 is a channel region 194. The state at this stage is shown in FIG. 21F.

Figure 21G:
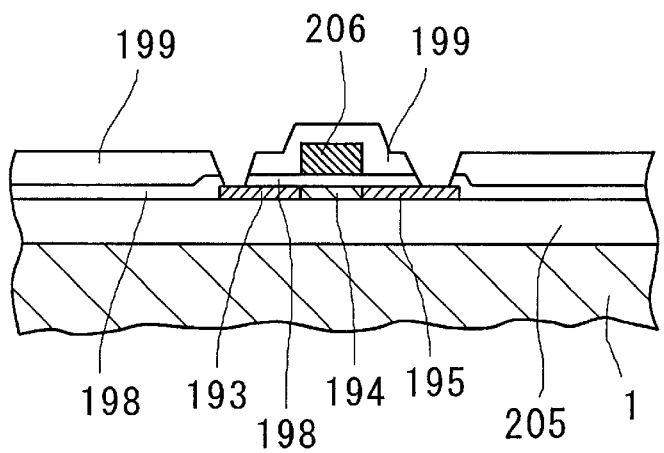

A first interlayer dielectric layer 199 is formed on the gate dielectric layer 190 to cover the gaze electrode 206 by a sputtering or CVD method. The layer 199 is typically made of $SiO_2$. The layer 199 and the gate dielectric layer 198 are selectively removed by photolithography and etching methods, forming contact holes that expose the source and drain regions 193 and 194, respectively, as shown in FIG. 21G.

Figure 21H:
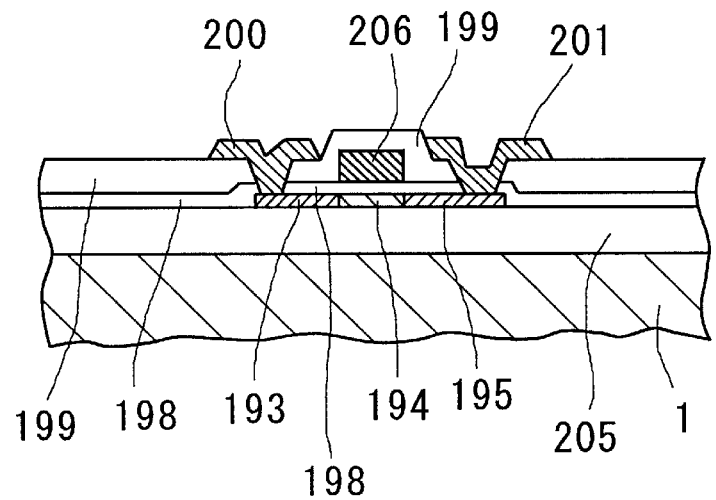

A conductive layer (typically, an Al layer) is deposited by a sputtering method and is patterned by photolithography and dry etching methods, thereby forming a drain electrode 200 and a source electrode 201, as shown in FIG. 21H. At this timer a current-supplying line 189 and electrode lines 161 are formed, as shown in FIG. 22.

Figure 21I:
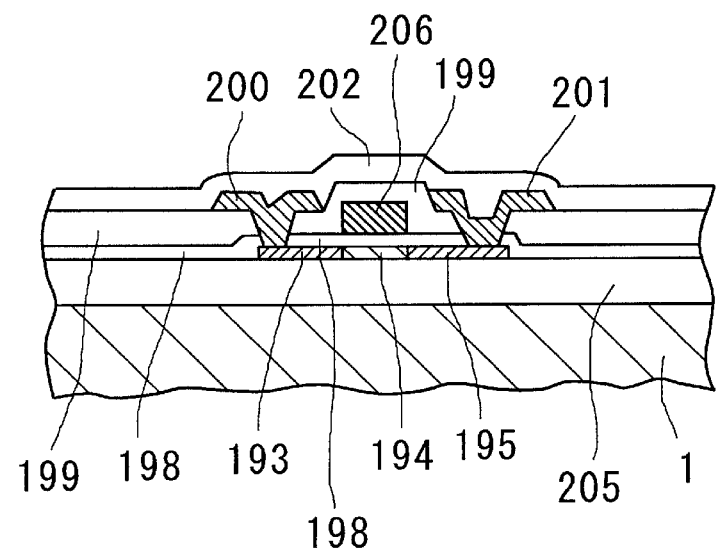

A dielectric layer (typically, a $SiO_2$ layer) is deposited by a sputtering method, thereby forming a second interlayer dielectric layer 202, as shown in FIG. 21I. At this stage, the structure of the element is as shown in FIG. 22. In FIG. 22, the layer 202 is omitted for simplification.

Subsequently, a hole-injection blocking layer is formed on the second interlayer dielectric layer 202 and is patterned, forming stripe-shaped lower hole-blocking layer 3a, as shown in FIGS. 23A and 23B.

Figure 24A:
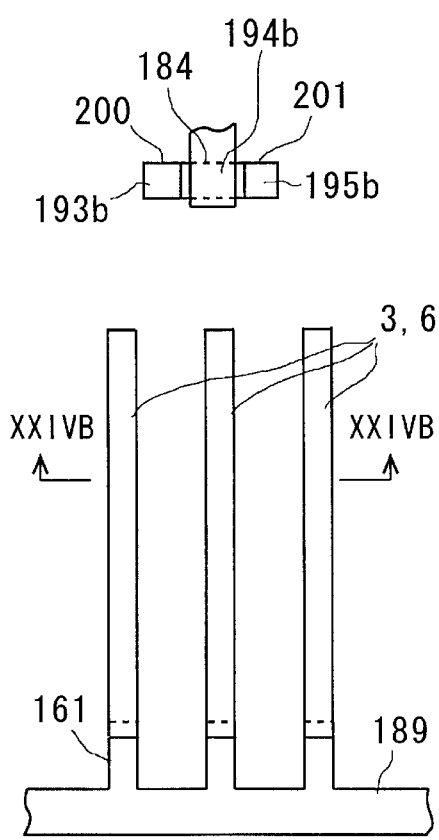
FIG. 24A is a schematic, partial plan view showing the method of fabricating the light-emitting element of the invention and its driving circuit, respectively, which is subsequent to the process of FIG. 23A.
Figure 24B:
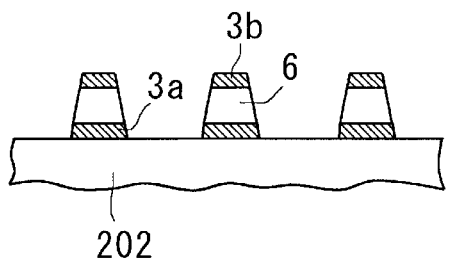
FIG. 24B is a schematic, partial cross-sectional view along the line XXIVB—XXIVB in FIG. 24A.

The electrode lines 161 are selectively exposed by selectively removing the second interlayer dielectric layer 202. A transparent conductive layer and a hole-injection blocking layer are deposited and then, they are patterned in such a way as to be overlapped with the lower hole-blocking layer 3a. In this state, the anode 6 and the upper hole-injection blocking layer 3b is formed, as shown in FIGS. 24A and 24B.

Furthermore, the light-emitting layer 2 is formed in the following way. Specifically, the layer 2 is typically formed by an evaporation or sputtering method using a mask. If an evaporation method is used, there is a possibility that some contrivance is necessary in such a way that particles to be deposited are deposited not only on the top face of the layer 3a but also on the side faces of the structure of the blocking layer 3a, the anode 6, and the blocking layer 3b. For example, the contrivance is to incline the crucible with respect to the base 1. This is because the particles to be deposited will have a linear directivity in the evaporation method.

Figure 25A:
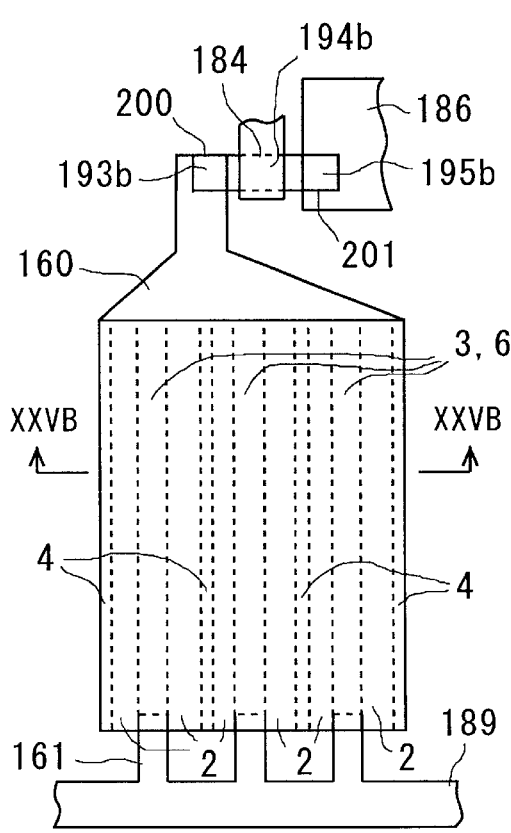
FIG. 25A is a schematic, partial plan view showing the method of fabricating the light-emitting element of the invention and its driving circuit, respectively, which is subsequent to the process of FIG. 24A.
Figure 25B:
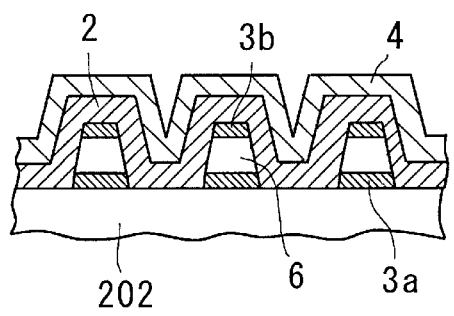
FIG. 25B is a schematic, partial cross-sectional view along the line XXVB—XXVB in FIG. 25A.

By selectively removing the second interlayer dielectric layer 202, the surface of the drain and source electrodes 200 and 201 are exposed. Then, by an evaporation or sputtering method, Al or AlLi is deposited and patterned, forming the cathode 4 and the electrode lines 160. At this time, the ground lines 186 are formed as well. The cathodes 4 and lines 160 may be formed by using a mask. If an evaporation method is used, there is a possibility that some contrivance is necessary in such a way that particles to be deposited are deposited not only on the top face of the layer 3a but also on the side faces of the structure of the blocking layer 3a, the anode 6, and the blocking layer 3b. For example, the contrivance is to incline the crucible with respect to the base 1. This is because the particles to be deposited will have a linear directivity in the evaporation method. The state at this stage is shown in FIGS. 25A and 25B.

With the above-described fabrication method, the cathode 4, the electrode lines 161, and the ground lines 186 are simultaneously formed. However, they may be formed in separated processes For example, the cathode 4 is made of AlLi while the lines 161 and 186 are made of Al.

EXAMPLES

The light-emitting device according to the invention, which has the structure shown in FIGS. 8, 9, 14, 17, 19A, and 20A, was actually fabricated by the inventors. The size of the pixel was square of 10 $\mu$m×10 $\mu$m and that of the display section was 40 mm ×40 mm.

The base 1 was made of no-alkali glass. The metal electrode layer is made of AlLi. The hole-injection sublayer 23 was made of $\alpha$-NPD. The light-emitting sublayer, which served as the electron transportation layer as well, is made of $Alq_3$. The anode buffer layer was made of polyaniline. The transparent electrode layer is made of a mixture of Indium oxide and tin oxide, i.e., ($In2_{-x}SnO_{3-y}$). The second switching line was made of WSi. The current-supplying line, the first switching line, and the ground lines were made of Al.

In addition, the prior-art display device as shown in FIG. 1 was fabricated.

With the inventive and prior-art display devices, the following rest was carried out:

Specifically, a potential of 5 V was applied to the anode 6 while a potential of 5V was applied to the first and second switching wiring lines, thereby emitting light. The brightness of these two devices were measured. As a result, the inventive display device has a brightness approximately 30% higher than the prior-art display device.

With the inventive device, the light generated in the light-emitting layer is emitted by way of the end faces of the light-emitting material layer 2. Thus, no part of the light propagates in the base 1, which means that loss of light is decreased. As a result, the output efficiency of light is improved and obtainable brightness of the screen is raised.

VARIATIONS

Needless to say, the present invention is not limited to the above-described embodiments. Any change or modification may be added to the configurations of the light-emitting device and those of the light-emitting element according to the embodiments within the spirit of the invention.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. An organic light-emitting device comprising:
   (a) a base having a surface;
   (b) a first electrode and a second electrode formed on the surface of the base;
      the first and second electrodes being located no be opposite to each other;
   (c) a light-emitting material layer located between the first and second electrodes;
      the light-emitting material layer having a first part and a second part;
      the first part being inclined with respect to the surface of the base at an inclination angle within a range from 45° to 90°;
      the second part being approximately parallel to the surface of the base; and
   (d) a carrier-blocking layer formed between the first electrode and the second part of the light-emitting material layer;
      the carrier-blocking layer having a function of blocking carriers emitted from the first electrode into the light-emitting material layer;
      wherein the first part of the light-emitting material layer forms as a light-emitting region while the second part of the light-emitting material layer forms a non-light-emitting region due to the function of the carrier-blocking layer,
      and wherein output light is emitted from the light-emitting region of the light-emitting material layer.

2. The device according to claim 1, wherein the first electrode is made of metal and the second electrode is made of metal.

3. The device according to claim 1, wherein output light is emitted to outside of the device by way of the base.

4. The device according to claim 1, wherein one of the first electrode has a penetrating opening through which output light is emitted to outside of the device.

5. The device according to claim 1, wherein the light-emitting material layer comprises one selected from the group consisting of
   (i) combination of a hole-injection/transportation sublayer, a light-emitting sublayer, and an electron-injection/transportation sublayer stacked in this order;
   (ii) combination of a hole-injection sublayer, a hole-transportation sublayer, a light-emitting sublayer, an electron-injection sublayer, and an electron-transportation sublayer stacked in this order;
   (iii) combination of a light-emitting sublayer having a function of a hole-injection/transportation sublayer, and an electron-injection/transportation sublayer stacked in this order;
   (iv) combination of a hole-injection/transportation sublayer, and a light-emitting sublayer having a function of a electron-injection/transportation sublayer stacked in this order; and
   (v) a single light-emitting layer having a function of a hole-injection/transportation sublayer and that of an electron-injection/transportation sublayer.

6. An organic light-emitting device comprising:
(a) a base having a surface;
(b) a first electrode and a second electrode formed on the surface of the base;
the first and second electrodes being located approximately to be opposite to each other;
(c) a light-emitting material layer located between the first and second electrodes;
the light-emitting material layer having a first part inclined with respect to the surface of the base at an inclination angle within a range from 45° to 90°; and
(d) a carrier-blocking layer formed between the first electrode and the second electrode;
the carrier-blocking layer having a function of blocking carriers emitted from the first electrode into the light-emitting material layer;
wherein the first part of the light-emitting material layer forms as a light-emitting region while the carrier-blocking layer forms a non-light-emitting region;
and wherein output light is emitted from the light-emitting region of the light-emitting material layer by way of the base or the second electrode.

7. The device according to claim 6, wherein the first electrode is made of metal and the second electrode is made of metal.

8. The device according to claim 6, wherein output light is emitted to outside of the device by way of the base.

9. The device according to claim 6, wherein one of the first electrode has a penetrating opening through which output light is emitted to outside of the device.

10. The device according to claim 6, wherein the light-emitting material layer comprises one selected from the group consisting of
(i) combination of a hole-injection/transportation sublayer, a light-emitting sublayer, and an electron-injection/transportation sublayer stacked in this order;
(ii) combination of a hole-injection sublayer, a hole-transportation sublayer, a light-emitting sublayer, an electron-injection sublayer, and an electron-transportation sublayer stacked in this order;
(iii) combination of a light-emitting sublayer having a function of a hole-injection/transportation sublayer, and an electron-injection/transportation sublayer stacked in this order;
(iv) combination of a hole-injection/transportation sublayer, and a light-emitting sublayer having a function of a electron-injection/transportation sublayer stacked in this order; and
(v) a single light-emitting layer having a function of a hole-injection/transportation sublayer and that of an electron-injection/transportation sublayer.

11. An organic light-emitting device comprising:
(a) a base having a surface;
(b) a first electrode formed on the surface of the base;
the first electrode having an approximately rectangular or trapezoidal Cross section perpendicular to the surface of the base;
the first electrode being elongated to extend along the surface of the base;
the first electrode having a top face opposite to the surface of the base and a pair of side faces located on opposite sides of the first electrode;
(c) a carrier-blocking layer formed to contact the top face of the first electrode;
the carrier-blocking layer having a function of blocking carriers emitted from the first electrode;
(d) a light-emitting material layer formed to extend along the first electrode in such a way as to contact the pair of side faces of the first electrode and the carrier-blocking layer; and
(e) a second electrode formed on the light-emitting layer;
wherein a first part of the light-emitting material layer that contacts the carrier-blocking layer forms as a non-light-emitting region while a second part of the light-emitting material layer that contacts the light-emitting material layer forms a light-emitting region;
and wherein output light is emitted from the light-emitting region of the light-emitting material layer.

12. The device according to claim 11, wherein the first electrode is made of metal and the second electrode is made of metal.

13. The device according to claim 11, wherein output light is emitted to outside of the device by way of the base.

14. The device according to claim 11 wherein one of the first electrode has a penetrating opening through which output light is emitted to outside of the device.

15. The device according to claim 11, wherein the light-emitting material layer comprises one selected from the group consisting of
(i) combination of a hole-injection/transportation sublayer, a light-emitting sublayer, and an electron-injection/transportation sublayer stacked in this order;
(ii) combination of a hole-injection sublayer, a hole-transportation sublayer, a light-emitting sublayer, an electron-injection sublayer, and an electron-transportation sublayer stacked in this order;
(iii) combination of a light-emitting sublayer having a function of a hole-injection/transportation sublayer, and an electron-injection/transportation sublayer stacked in this order;
(iv) combination of a hole-injection/transportation sublayer, and a light-emitting sublayer having a function of a electron-injection/transportation sublayer stacked in this order; and
(v) a single light-emitting layer having a function of a hole-injection/transportation sublayer and that of an electron-injection/transportation sublayer.

16. An organic light-emitting device comprising:
(a) a base having a surface;
(b) a first electrode formed on the surface of the base;
the first electrode having an approximately rectangular or trapezoidal cross section perpendicular to the surface of the base;
the first electrode being elongated to extend along the surface of the base;
the first electrode having a top face opposite to the surface of the base and a pair of side faces located on opposite sides of the first electrode;
(c) a carrier-blocking layer formed to contact the top face of the first electrode;
the carrier-blocking layer having a function of blocking carriers emitted from the first electrode;
(d) a light-emitting material layer formed to extend along the first electrode in such a way as to contact the pair of side faces of the first electrode and the carrier-blocking layer;
no part of the light-emitting material layer being approximately parallel to the surface of the base; and
(e) a second electrode formed on the light-emitting material layer;
wherein a first part of the light-emitting material layer that contacts the carrier-blocking layer forms as a non-light-emitting region while a second part of the light-emitting material layer that contacts the light-emitting material layer forms a light-emitting region; and wherein output light is emitted from the light-emitting region of the light-emitting material layer.

17. The device according to claim 16, wherein the first electrode is made of metal and the second electrode is made of metal.

18. The device according to claim 16, wherein output light is emitted to outside of the device by way of the base.

19. The device according to claim 16 wherein one of the first electrode has a penetrating opening through which output light is emitted to outside of the device.

20. The device according to claim 16, wherein the light-emitting material layer comprises one selected from the group consisting of (i) combination of a hole-injection/transportation sublayer, a light-emitting sublayer, and an electron-injection/transportation sublayer stacked in this order;

(ii) combination or a hole-injection sublayer, a hole-transportation sublayer, a light-emitting sublayer, an electron-injection sublayer, and an electron-transportation sublayer stacked in this order;

(iii) combination of a light-emitting sublayer having a function of a hole-injection/transportation sublayer, and an electron-injection/transportation sublayer stacked in this order;

(iv) combination of a hole-injection/transportation sublayer, and a light-emitting sublayer having a function of a electron-injection/transportation sublayer stacked in this order; and (v) a single light-emitting layer having a function of a hole-injection/transportation sublayer and that of an electron-injection/transportation sublayer.

* * * * *